United States Patent
Lee

(10) Patent No.: US 10,062,672 B2
(45) Date of Patent: Aug. 28, 2018

(54) LIGHT SOURCE MODULE

(71) Applicant: LG Innotek Co., Ltd., Seoul (KR)

(72) Inventor: Jung Oh Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/315,256

(22) PCT Filed: Jul. 20, 2015

(86) PCT No.: PCT/KR2015/007515
§ 371 (c)(1),
(2) Date: Nov. 30, 2016

(87) PCT Pub. No.: WO2016/013831
PCT Pub. Date: Jan. 28, 2016

(65) Prior Publication Data
US 2017/0200706 A1    Jul. 13, 2017

(30) Foreign Application Priority Data

Jul. 23, 2014  (KR) .................. 10-2014-0093594
Nov. 3, 2014  (KR) .................. 10-2014-0151592
(Continued)

(51) Int. Cl.
*H01L 25/075* (2006.01)
*H01L 23/00* (2006.01)
(Continued)

(52) U.S. Cl.
CPC ........ *H01L 25/0753* (2013.01); *A44C 5/0007* (2013.01); *A44C 9/0053* (2013.01);
(Continued)

(58) Field of Classification Search
CPC ..... H01L 25/0753; H01L 24/17; H01L 24/48; H01L 33/00–33/648; H01L 27/156; A44C 5/0007; A44C 9/0053
(Continued)

(56) References Cited

U.S. PATENT DOCUMENTS

2003/0160256 A1    8/2003  Durocher et al.
2007/0221928 A1*   9/2007  Lee .................. H01L 33/486
                                                        257/79
(Continued)

FOREIGN PATENT DOCUMENTS

JP      2014090161 A    5/2014
KR   1020050119045 A   12/2005
(Continued)

OTHER PUBLICATIONS

International Search Report in International Application No. PCT/KR2015/007515, filed Jul. 20, 2015.

*Primary Examiner* — Mohsen Ahmadi
*Assistant Examiner* — Patricia Reddington
(74) *Attorney, Agent, or Firm* — Saliwanchik, Lloyd & Eisenschenk

(57) ABSTRACT

A light source module according to an embodiment includes: a flexible printed circuit board that has first and second pads; and a plurality of light emitting chips that are arranged on the first pads of the flexible printed circuit board, respectively, wherein the plurality of light emitting chips include a plurality of first arrays that are arranged in a first direction and second arrays that are arranged in a second direction that is different from the first direction, at least two of light emitting chips in each first array are connected to each other by the flexible printed circuit board, light emitting chips in each second array are electrically isolated from each other, the light source module further includes connection members, each of which is connected to at least one of the light (Continued)

emitting chips of the second array and a corresponding second pad of the flexible printed circuit board, and the connection members extend in the second direction.

20 Claims, 24 Drawing Sheets

(30) Foreign Application Priority Data

Nov. 4, 2014 (KR) .................. 10-2014-0151932
Nov. 5, 2014 (KR) .................. 10-2014-0152736

(51) Int. Cl.
| | |
|---|---|
| *H01L 33/54* | (2010.01) |
| *H01L 33/62* | (2010.01) |
| *H01L 33/48* | (2010.01) |
| *H01L 33/60* | (2010.01) |
| *A44C 9/00* | (2006.01) |
| *A44C 5/00* | (2006.01) |
| *B60R 1/08* | (2006.01) |
| *B60R 1/12* | (2006.01) |

(52) U.S. Cl.
CPC .............. *H01L 24/16* (2013.01); *H01L 24/17* (2013.01); *H01L 24/48* (2013.01); *H01L 33/483* (2013.01); *H01L 33/54* (2013.01); *H01L 33/60* (2013.01); *H01L 33/62* (2013.01); *B60R 1/088* (2013.01); *B60R 1/12* (2013.01); *B60R 1/1207* (2013.01); *B60R 2001/1215* (2013.01); *H01L 2224/16227* (2013.01); *H01L 2224/1703* (2013.01); *H01L 2224/4814* (2013.01); *H01L 2224/48105* (2013.01); *H01L 2224/48228* (2013.01)

(58) Field of Classification Search
USPC .......................................................... 257/91
See application file for complete search history.

(56) References Cited

U.S. PATENT DOCUMENTS

| | | | | |
|---|---|---|---|---|
| 2011/0198632 | A1* | 8/2011 | Lerman | H01L 25/0753 257/91 |
| 2011/0303941 | A1* | 12/2011 | Lee | H01L 33/486 257/98 |
| 2012/0018757 | A1* | 1/2012 | Jeong | H01L 33/38 257/98 |
| 2014/0091335 | A1* | 4/2014 | Satake | F21V 17/10 257/88 |

FOREIGN PATENT DOCUMENTS

| | | |
|---|---|---|
| KR | 20100020105 A | 2/2010 |
| KR | 101035442 B1 | 5/2011 |
| KR | 1020110115739 A | 10/2011 |
| KR | 20120014390 A | 2/2012 |
| KR | 20120040549 A | 4/2012 |
| KR | 20130006823 A | 1/2013 |
| KR | 20130130673 A | 12/2013 |
| KR | 20140015089 A | 2/2014 |
| KR | 20140065920 A | 5/2014 |

* cited by examiner (a)

LIGHT SOURCE MODULE

CROSS-REFERENCE TO RELATED APPLICATIONS

This application is the U.S. national stage application of International Patent Application No. PCT/KR2015/007515, filed Jul. 20, 2015, which claims priority to Korean Application Nos. 10-2014-0093594, filed Jul. 23, 2014; 10-2014-0151592, filed Nov. 3, 2014; 10-2014-0151932, filed Nov. 4, 2014; and 10-2014-0152736, filed Nov. 5, 2014, the disclosures of each of which are incorporated herein by reference in their entirety.

BACKGROUND

The present disclosure relates to a light source module, and a display module, an accessory, and a mirror having the same.

Various kinds of electronic devices such as a mobile phone and a television (TV) have appeared. Such an electronic device has a printed circuit board (PCB) formed therein on which various components that are elements enabling an operation of the electronic device are mounted.

In general, the printed circuit board is a circuit substrate having various kinds of many components such as an integrated circuit (IC) or a resistor, which are densely mounted on a flat plate of the circuit substrate, the flat plate being formed of paper phenol resin or glass epoxy resin, and having a circuit which interconnects the components and is densely shortened on and fixed to the resin flat plate.

A light emitting diode (LED), which is a diode that is mounted on a printed circuit board and emits light when a current is applied thereto, refers to a light emitting element in which electrons are excited to a higher energy level when minority carriers are injected into an active layer of the light emitting element, and when the electrons return to a stable state again, energy owned by the electrons is converted into electromagnetic waves having wavelengths of light and which radiates the electromagnetic waves.

In recent years, with rapid development of a semiconductor technology, a product having high illuminance and high quality may be manufactured with deviating from a general-purpose product having low illuminance. Further, as a blue diode and a white diode having high performance are realized, application of the LED has been expanded to a next-generation light source, various kinds of display devices, and the like.

SUMMARY

An embodiment provides a light source module having a flexible printed circuit board on which a plurality of light emitting chips are mounted.

An embodiment provides a display module that displays information by a plurality of light emitting chips mounted on a flexible printed circuit board.

An embodiment provides a light source module having a flexible printed circuit board on which a light emitting chip is mounted and which may be bent in a predetermined direction, and a display module having the same.

An embodiment provides an accessory including a light source module having a flexible printed circuit board on which a plurality of light source chips are mounted.

Further, an embodiment provides an accessory including a flexible light source module and thus having high visibility through a small-sized display.

An embodiment provides a mirror that displays various pieces of information by applying a light emitting diode (LED) having high transmissivity.

Further, an embodiment provides a mirror having a display function, which includes a mirror part in which a reflectivity of a first area that overlaps a light source module and a reflectivity of a second area except for the same are identical to each other.

Further, an embodiment provides a mirror having a display function, which includes a mirror part in which a thickness of a first area that overlaps a light source module and a thickness of a second area except for the same are identical to each other.

A light source module according to an embodiment includes: a flexible printed circuit board that has first and second pads; and a plurality of light emitting chips that are arranged on the first pads of the flexible printed circuit board, respectively, wherein the plurality of light emitting chips include a plurality of first arrays that are arranged in a first direction and second arrays that are arranged in a second direction that is different from the first direction, at least two of light emitting chips in each first array are connected to each other by the flexible printed circuit board, light emitting chips in each second array are electrically isolated from each other, the light source module further includes connection members, each of which is connected to at least one of the light emitting chips of the second array and a corresponding second pad of the flexible printed circuit board, and the connection members extend in the second direction.

An embodiment may provide a light source module and a display module having a flexible printed circuit board on which a plurality of light emitting chips are mounted.

An embodiment may reduce manufacturing processes by mounting not a light emitting element package but a light emitting chip on a flexible printed circuit board.

A light source module according to an embodiment may improve brightness by increasing the density of light emitting chips.

An embodiment may provide a light source module having a thin thickness and having a flexible printed circuit board on which light emitting chips are mounted.

A light source module according to an embodiment may reduce a thickness of a bezel.

In an embodiment, a light source module may be bent in a direction that is different from a connection direction of a plurality of light emitting chips.

An embodiment may provide a display module that may display information by using light emitting chips of a light source module.

An embodiment may improve reliabilities of a light source module on which a light emitting chip is mounted and a display module having the same.

An embodiment may provide high visibility to a small-sized display by mounting a flexible light emitting module on an accessory such as a ring and a bracelet.

According to an embodiment of the present disclosure, a display module that may display information by using light emitting chips of a light source module is provided, so that because transmissivity of the light source module included in the display module is excellent, a separate display space, for example, the existing display room mirror, is not required. Accordingly, convenience of manufacturing processes may be improved, and at the same time manufacturing costs may be reduced.

Further, according to an embodiment of the present disclosure, a bendable display module is applied, so that visibility thereof may be improved as compared with a liquid crystal display device applied to the existing mirror, and degree of freedom of the size of the display and ease of information transfer may be increased as well.

BRIEF DESCRIPTION OF THE DRAWINGS

The present invention will become more fully understood from the detailed description given herein below and the accompanying drawings, which are given by illustration only, and thus are not limitative of the present invention, and wherein.

DETAILED DESCRIPTION OF THE EMBODIMENTS

In description of embodiments, when it is described that a substrate, a frame, a sheet, a layer, a pattern or the like is formed "on" or "under" a substrate, a frame, a sheet, a layer, a pattern or the like, "on" and "under" include that the elements are formed "directly" or "indirectly with another element interposed therebetween". Further, a reference related to "on" or "under" of each component is described with reference to the accompanying drawings.

Figure 1:
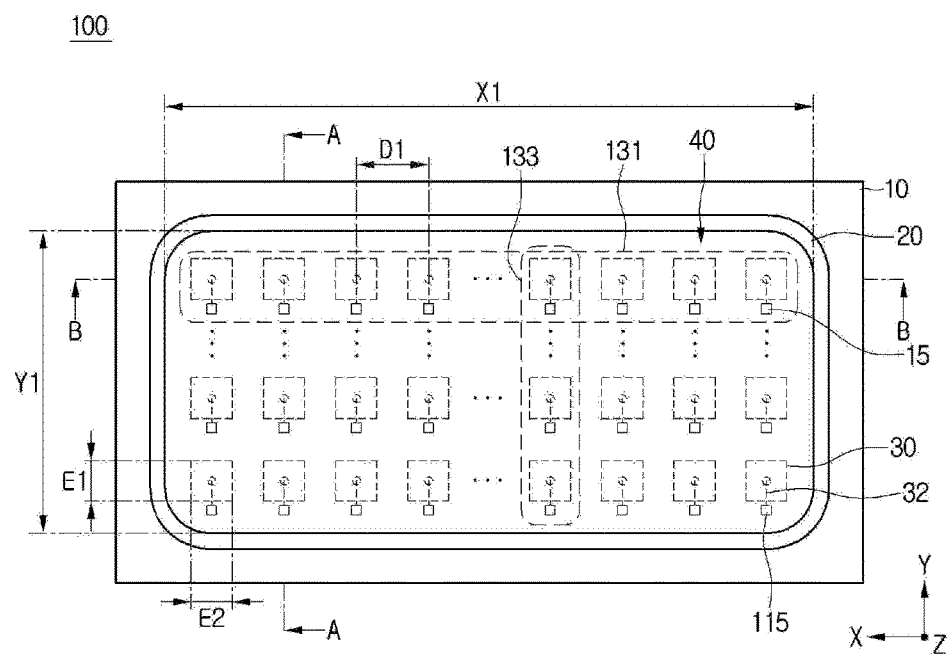
FIG. 1 is a plan view illustrating a light source module according to a first embodiment.
Figure 2:
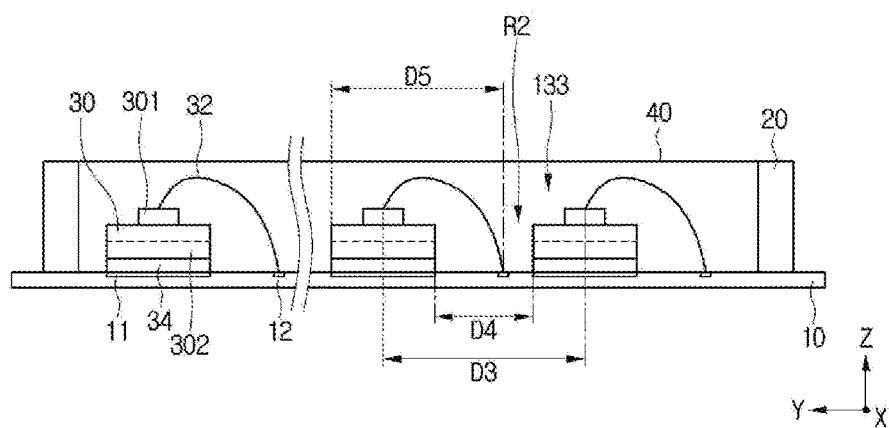
FIG. 2 is a sectional view illustrating the light source module of FIG. 1, taken along line A-A of FIG. 1.
Figure 3:
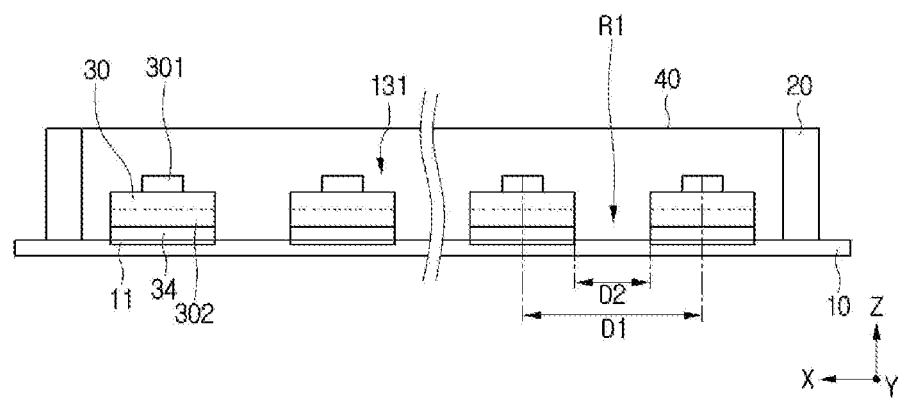
FIG. 3 is a sectional view illustrating the light source module of FIG. 1, taken along line B-B of FIG. 1.

FIG. 1 is a plan view illustrating a light source module according to an embodiment, FIG. 2 is a sectional view illustrating the light source module of FIG. 1, taken along line A-A of FIG. 1, and FIG. 3 is a sectional view illustrating the light source module of FIG. 1, taken along line B-B of FIG. 1.

Referring to FIGS. 1 to 3, a light source module 100 includes: a flexible printed circuit board 10; a reflective member 20 that is arranged on a circumference of a light emitting area on the flexible printed circuit board 10; a plurality of light emitting chips 30 that are arranged within the reflective member 20; and a mold member 40 that covers the plurality of light emitting chips 30 within the reflective member 20.

The plurality of light emitting chips 30 are mounted on the flexible printed circuit board 10. The plurality of light emitting chips 30 may be arranged in a matrix structure. The light emitting chips 30 may include, for example, a plurality of first arrays 131 that are arranged in a first direction X, and a plurality of second arrays 133 that are arranged in a second direction Y that is different from the first direction X. The first direction X and the second direction Y may be perpendicular to each other.

The plurality of first arrays 131 are arranged in a row direction or a transverse direction, and the plurality of second arrays 133 are arranged in a column direction or a longitudinal direction. The number of the second arrays 133 may be 1.5 times larger than, for example, two times larger than, the number of the first arrays 131. The light emitting area where the light emitting chips 30 are arranged may be arranged such that a length X1 thereof in the first direction X is 1.5 times larger than, for example, two times larger than, a length Y1 thereof in the second direction Y. The number of the light emitting chips 30 arranged in each first array 131 is larger than the number of the light emitting chips 30 arranged in each second array 133. For example, the number of the light emitting chips 30 arranged in the first array 131 is 1.5 times larger than, for example, two times larger than, the number of the light emitting chips 30 arranged in the second array 133. In an embodiment, the length X1 of the light emitting area of the flexible printed circuit board 10 in the first direction X is larger than the length Y1 thereof in the second direction Y, so that the flexible printed circuit board 10 may be used while being effectively bent with respect to the first direction X.

Figure 5:
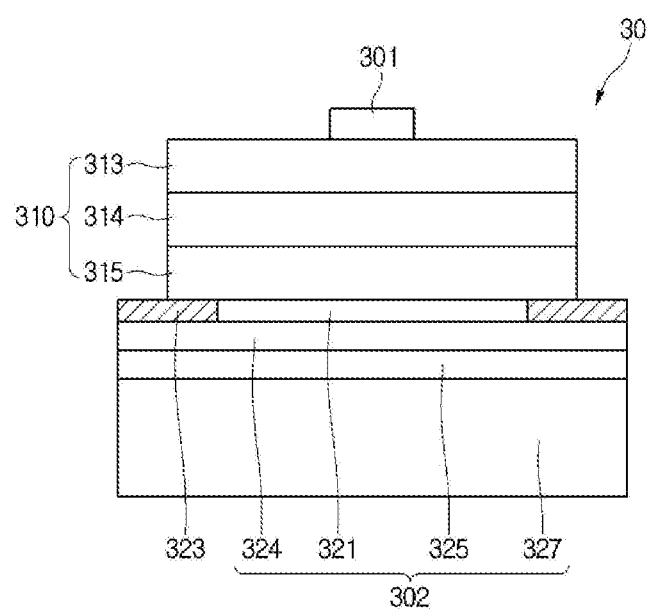
FIG. 5 is a view illustrating an example of a light emitting chip of the light source module of FIG. 2.

As illustrated in FIG. 5, each light emitting chip 30 includes a first upper electrode 301 and a second lower electrode 302. As illustrated in FIGS. 2 and 3, the second electrode 302 of the light emitting chip 30 is connected to a first pad 11 of the flexible printed circuit board 10 through a bonding member 34. At least two of the light emitting chips 30 arranged along the first array 131 may be connected to each other by the first pad 11 of the flexible printed circuit board 10. The first electrode 301 is connected to a second pad 12 by a connection member 32. The light emitting chips 30 arranged along each first array 133 are electrically isolated from each other by the second pad 12. Connection members 32 include a conductive wire.

Transverse and longitudinal lengths E1 and E2 of each light emitting chip 30 may be identical to each other or different from each other, and at least one of the transverse and the longitudinal lengths E1 and E2 may be 500 µm or less, for example, 300 µm or less.

Referring to FIGS. 1 and 2, wires, which correspond to the connection member 32, are arranged in a region R2 between the light emitting chips 30 in the second array 133. Thus, a second stress generated when the flexible printed circuit board 10 is bent with respect to the second direction Y is applied larger by the light emitting chips 30 and the connection members 32. That is, the second stress may increase due to a distance D5 between one side surface of the light emitting chip 30 and an opposite end of the connection member 32.

Further, as illustrated in FIGS. 1 and 3, because the connection members 32 as illustrated in FIG. 2 are not arranged in a region R1 between the light emitting chips 30 in the first array 131, a first stress generated when the flexible printed circuit board 10 is bent with respect to the first direction X may be smaller than the second stress. Further, the connection members 32 extend in the second direction to overlap a corresponding light emitting chip 30, so that the second stress may be larger applied in the second direction Y, but a stress having a form of one line may be applied in the first direction X. Accordingly, the flexible printed circuit board 10 has a length in the first direction, which is 1.5 times larger than a length in the second direction, for example, is two times larger than a length in the second direction, so that a stress when the flexible printed circuit board 10 is bent with respect to the first direction may be reduced.

As illustrated in FIGS. 2 and 3, an interval D4 and a period D3 between the light emitting chips 30 in the second array 133 may be larger than or equal to an interval D2 and a period D1 between the light emitting chips 30 in the first array 131. At least one of the intervals D2 and D4 may be formed larger than at least one of a transverse length and a longitudinal length of the light emitting chip 30, and includes a range of, for example, 0.3 mm to 0.7 mm. Such intervals D2 and D4 may be changed based on the size of the light emitting chip 30.

Figure 4:
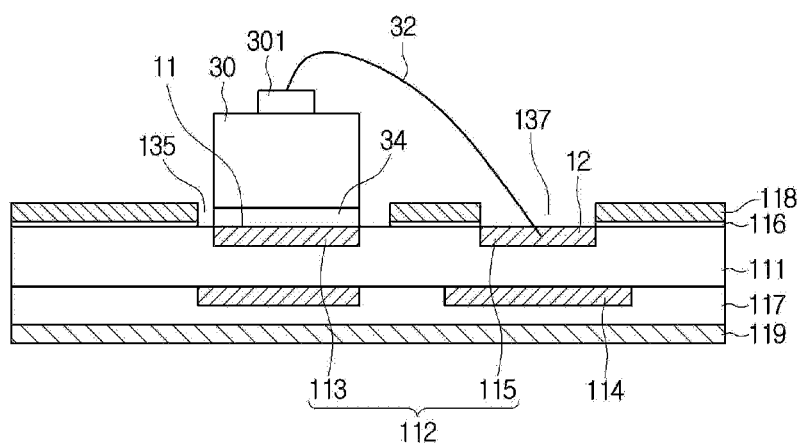
FIG. 4 is a view illustrating a substrate of the light source module of FIG. 2 in detail.

As illustrated in FIG. 4, the flexible printed circuit board 10 includes an insulating film 111, a first wiring layer 112, a second wiring layer 114, a first cover lay 118 and a second cover lay 119, wherein the insulating film 111 may include a polyimide film or various insulating films formed of polyester, polyethylene or the like may be used as the insulating film 111. The insulating film 111 has a thickness of 70 µm or less, for example, a range of 10 µm to 40 µm, but the present disclosure is not limited thereto. When the thickness of the insulating film 111 exceeds the range, bending is difficult, and when the thickness thereof is smaller than the range, elasticity after bending is reduced.

The first wiring layer 112 is attached on an upper surface of the insulating film 111, and the second wiring layer 114 is attached on a lower surface of the insulting film 111. When the first and second wiring layers 112 and 114 are attached, a desired pattern may be formed through etching. The second wiring layer 144 may be omitted, but the present disclosure is not limited thereto.

The first and second wiring layers 112 and 114 may be attached to each other by an adhesive 116 or may be manufactured integrally with the insulating film 111 by applying polymer resin to the first and second wiring layers 112 and 114, and then curing it. The first cover lay 118 is bonded to the first wiring layer 112 through the adhesive 116 to protect the first wiring layer 112. Open areas 135 and 137 may be formed on the first cover lay 118, and the first and second pads 11 and 12 of the first wiring layer 112 may be exposed to the open areas 135 and 137. The first pad 11 may be exposed to an area corresponding to an area of a lower surface of the light emitting chip.

The second cover lay 119 is bonded through an adhesive 117 to protect the second wiring layer 114. The first and second cover lays 118 and 119 may be formed of a transparent film or solder resist, but the present disclosure is not limited thereto.

Figure 6:
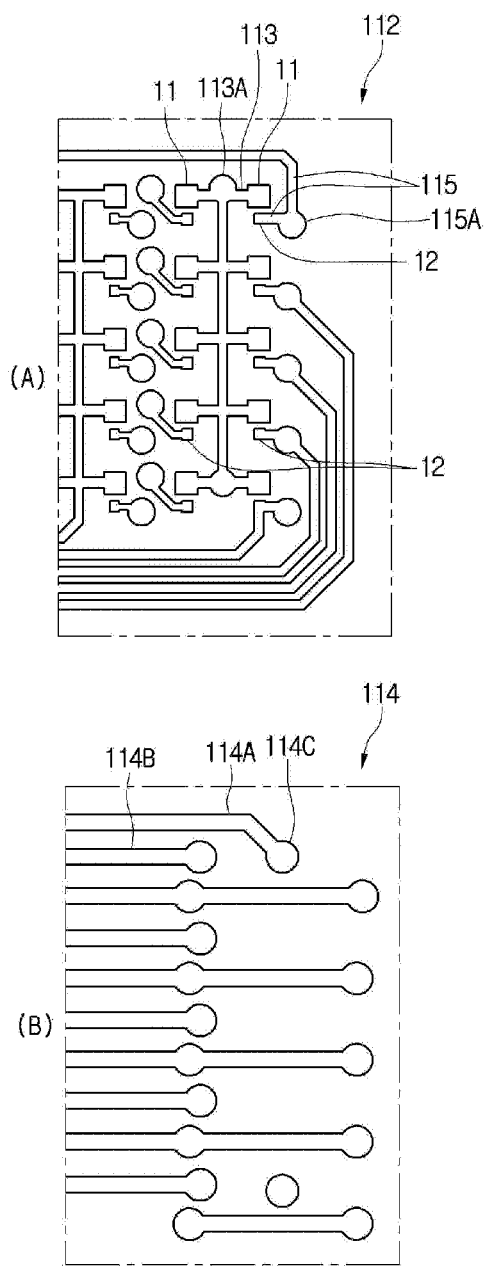
FIGS. 6A and 6B are views illustrating a pattern of first and second wiring layers of the substrate of FIG. 4, respectively.

Referring to FIG. 6A, in a pattern of the first wiring layer 112, a first connection pattern 113 may be connected between adjacent first pads 11, and the first connection pattern 113 may be connected to the second wiring layer 114 through a first via 113A. The second pad 12 may be spaced apart from the first pad 11, may extend by a second connection pattern 115, and may be connected to the second wiring layer 114 through a second via 115A. The first wiring layer 112 may interconnect the light emitting chips in the first layer by the first pads 11 and the first connection patterns 113. That is, at least two of the light emitting chips in each second array may be connected to each other by the first connection pattern 113 of the first wiring layer 112. The light emitting chips in the second array may be connected in parallel to each other by the second pad 12 and the second connection pattern 115.

Referring to FIG. 6B, the second wiring layer 114 has third and fourth connection patterns 114A and 114B, and third vias selectively connected to the first wiring layer 112 are provided in the third and fourth connection patterns 114A and 114B. The first and second wiring layers 112 and 114 of the flexible printed circuit board 10 may selectively connect the plurality of light emitting chips 30. A control unit (not illustrated) may selectively switch on or off individual light emitting chips 30 through the first and second wiring layers 112 and 114 of the flexible printed circuit board 10.

Meanwhile, as illustrated in FIGS. 1 to 3, the reflective member 20 is arranged on an outer circumference of an upper surface of the flexible printed circuit board 10. The reflective member 20 may be formed to have a consecutively connected frame shape. The reflective member 20 may reflect light that is emitted from the light emitting chips 30, on the circumference of the light emitting chips 30. The reflective member 20 may include materials such as silicone and epoxy or may include materials such as solder resist or a mask material. The reflective member 20 may be white or black, but the present disclosure is not limited thereto.

The reflective member 20 is arranged on a circumference of the mold member 40. The reflective member 20 may serve as a dam that prevents the mold member 40 from being overflowed.

The mold member 40 may be formed of a soft mold material, and for example, may be formed of soft silicone. The mold member 40 is expanded when the flexible printed circuit board 10 is bent at a predetermined curvature and is restored when the flexible printed circuit board 10 is restored. Here, the mold member 40 is molded on the connection members 32 in addition to the light emitting chips 30, thereby increasing the second stress in the second arrays 133. Accordingly, the bending and the restoring in an arrangement direction of the first arrays 131 may be facilitated.

The mold member 40 may include a light-transmitting material. The light-transmitting material emits light that is emitted from the light emitting chips 30. The mold member 40 may include fluorescent substances. The fluorescent substances convert a portion of the light emitted from the light emitting chips 30. The light emitting chips 30 may emit at least one of ultraviolet rays, blue light, red light, green light and white light. The fluorescent substances may include at least one of red, yellow, green and blue fluorescent substances. As another example, individual fluorescent substance layers may be arranged on the light emitting chip 30 to convert a wavelength of the light emitted from the light emitting chip 30. In this case, the mold member 40 may not be formed or may be provided using a clean molding material not having fluorescent substances.

FIG. 5 is a view illustrating an example of a light emitting chip 30 according to an embodiment.

Referring to FIG. 5, the light emitting chip 30 includes: a first electrode 301; a light emitting structure 310; a second electrode 302 below the light emitting structure 310; and a protective layer 323 on a circumference of a lower surface of the light emitting structure 310.

The light emitting structure 310 includes a first conductive semiconductor layer 313, an active layer 314, and a second conductive semiconductor layer 315. The first conductive semiconductor layer 313 is implemented using a group III-IV compound semiconductor that is doped with a first conductive dopant, and the first conductive semiconductor layer 313 includes an empirical formula of $In_xAl_yGa_{1-x-y}N$ ($0 \leq x \leq 1$, $0 \leq y \leq 1$, $0 \leq x+y \leq 1$). The first conductive semiconductor layer 313 may include a stack structure of layers including at least one of compound semiconductors formed of GaN, InN, AlN, InGaN, AlGaN, InAlGaN, AlInN, AlGaAs, GaP, GaAs, GaAsP or AlGaInP. The first conductive semiconductor layer 313 is an n-type semiconductor layer, and the first conductive dopant is an n-type dopant, and includes Si, Ge, Sn, Se or Te.

The active layer 314 is arranged below the first conductive semiconductor layer 313 and selectively includes a single quantum well structure, a multiple quantum well structure, a quantum wire structure, or a quantum dot structure. The active layer 314 includes a period of a well layer and a wall layer. The well layer may include an empirical formula of $In_xAl_yGa_{1-x-y}N$ ($0 \leq x \leq 1$, $0 \leq y \leq 1$, $0 \leq x+y \leq 1$), and the wall layer may include an empirical formula of $In_xAl_yGa_{1-x-y}N$ ($0 \leq x \leq 1$, $0 \leq y \leq 1$, $0 \leq x+y \leq 1$). The well layer/the wall layer may be formed in one or more periods by using stack structures of, for example, InGaN/GaN, GaN/AlGaN, InGaN/AlGaN, InGaN/InGaN and InAlGaN/InAlGaN.

The second conductive semiconductor layer 315 is arranged below the active layer 314. The second conductive semiconductor layer 315 is a semiconductor doped with a second conductive dopant, and for example, includes an empirical formula of $In_xAl_yGa_{1-x-y}N$ ($0 \leq x \leq 1$, $0 \leq y \leq 1$, $0 \leq x+y \leq 1$). The second conductive semiconductor layer 315 may be formed by any one of the compound semiconductors formed of GaN, InN, AlN, InGaN, AlGaN, InAlGaN, AlInN, AlGaAs, GaP, GaAs, GaAsP or AlGaInP. The second conductive semiconductor layer 315 is a p-type semiconductor layer, and the second conductive dopant, which is a p-type dopant, may include Mg, Zn, Ca, Sr and Ba.

The second conductive semiconductor layer 315 may include a superlattice structure, and the superlattice structure may include an InGaN/GaN superlattice structure or an AlGaN/GaN superlattice structure. The superlattice structure of the second conductive semiconductor layer 315 may diffuse a current abnormally included in a voltage to protect the active layer 314.

The protective layer 323 is arranged on a circumference of the lower surface of the light emitting structure 310. The protective layer 323 may prevent some metals of the second electrode 302 from becoming closer to layers of the light emitting structure 310. The protective layer 323 may be selected from metal, metal oxide and insulating materials, and may be formed selectively of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), $SiO_2$, $SiO_x$, $SiO_xN_y$, $Si_3N_4$, $Al_2O_3$ or $TiO_2$.

The second electrode 302 is arranged below the second conductive semiconductor layer 315, and the second electrode 302 includes a contact layer 321, a reflective layer 324, a junction layer 325 and a support member 327. The contact layer 321 is in contact with the second conductive semiconductor layer 315 and a material of the contact layer 321 may be selected from metal, metal oxide and metal nitride. For example, the contact layer 321 may be formed of any one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), Ag, Ni, Al, Rh, Pd, Ir, Ru, Ma, Zn, Pt, Au and Hf and a material configured by a selective combination thereof.

The reflective layer 324 may be arranged below the contact layer 321 and the protective layer 323. The reflective layer 324 may be formed of metal, for example, Ag, Ni, Al, Rh, Pd, Ir, Ru, Mg, Zn, Pt, Au or Hf, and a selective combination thereof. The reflective layer 324 may be formed wider than the width of the light emitting structure 310, and this structure may improve light reflection efficiency.

The junction layer 325 is bonded between the support member 327 and the reflective layer 324.

The support member 327, which is a base substrate, is implemented by metal such as Cu, Au, Ni, Mo and Cu—W or a carrier wafer (e.g. Si, Ge, GaAs, ZnO and SiC).

As illustrated in FIGS. 2 and 3, the second electrode 302 may be connected to the second pad 12 of the flexible printed circuit board 10 through the bonding member 34. The first electrode 301 is arranged in the light emitting structure 310 and is connected to the first conductive semiconductor layer 313. As illustrated in FIGS. 2 and 3, the first electrode 301 is connected to the connection member 32.

Figure 7:
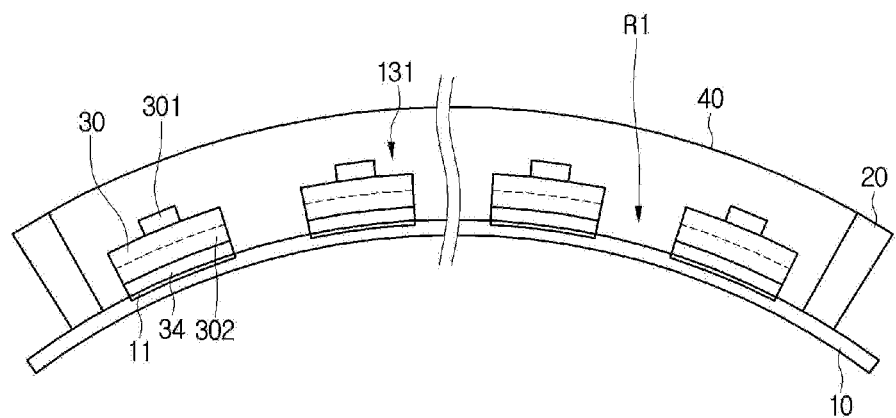
FIG. 7 is a view illustrating a bending direction of a flexible printed circuit substrate according to the first embodiment.
Figure 8:
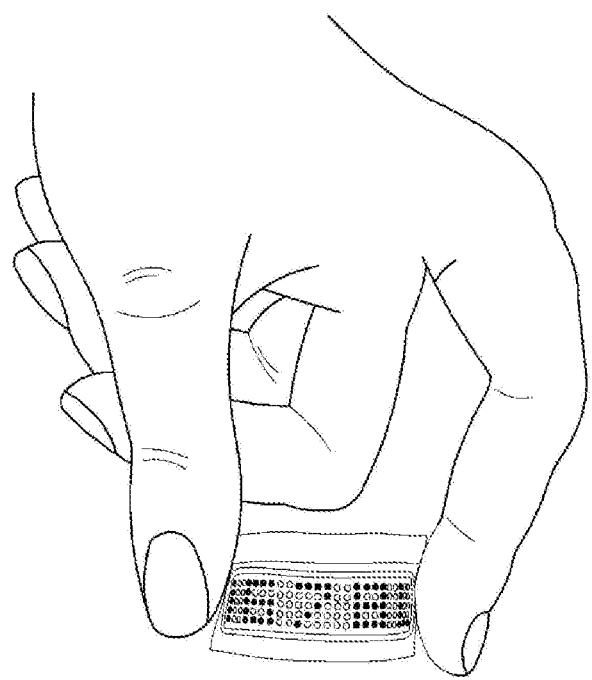
FIG. 8 is a view illustrating a bending example in an information display state of the light source module according to an embodiment.
Figure 9:
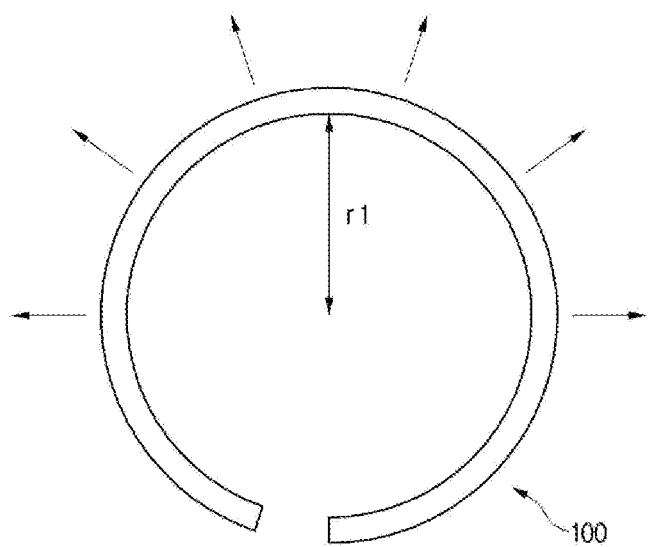
FIG. 9 is a view illustrating a bending state of the light source module according to the embodiment.

Referring to FIG. 7, the light source module 100 may be bent with respect to the first direction X. After being bent with respect to a direction of the first arrays 131, the flexible printed circuit board 10 has a bending radius of 150 mm or less, for example, 100 mm or less. As illustrated in FIG. 8, the light source module 100 may be bent in a state in which the light emitting chips display information. Referring to FIG. 9, when the light source module 100 is maximally bent, a bending radius r1 thereof may be formed to have a range of 5 mm to 10 mm. The bending shape may include a circular shape and an elliptical shape, for example, a ring shape. Such a bendable light source module 100 controls the light source chips, which are point light sources, to be selectively switched on or off, and may thus be provided as a display module.

Figure 10:
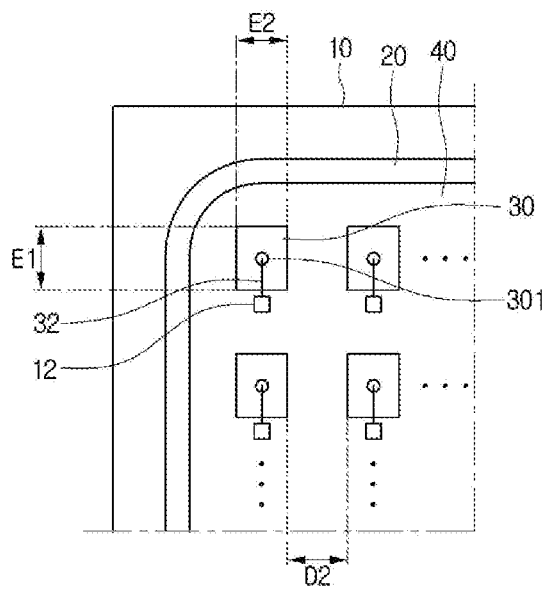
FIG. 10 is a view illustrating another example of the light source module of FIG. 1.

FIG. 10 illustrates an example where the transverse length E1 and the longitudinal length E2 of the light emitting chips 30 are different from each other. For example, because the light emitting chips 30 are arranged such that the transverse length E1 thereof are smaller than the longitudinal length E2 thereof, an interval between the light emitting chips 30 may be further widened. Accordingly, a stress based on bending of the flexible printed circuit board 10 may be smaller than that of the first embodiment.

Figure 11:
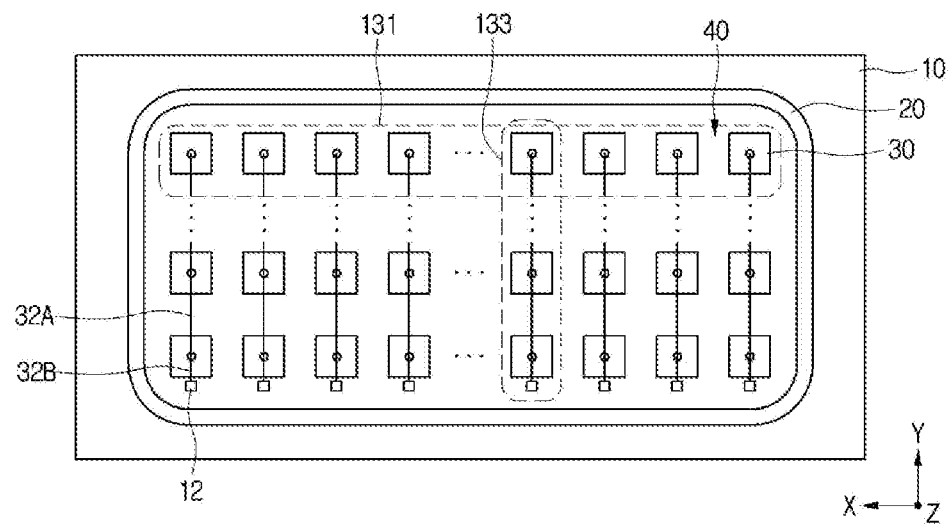
FIG. 11 is a plan view illustrating a light source module according to a second embodiment.
Figure 12:
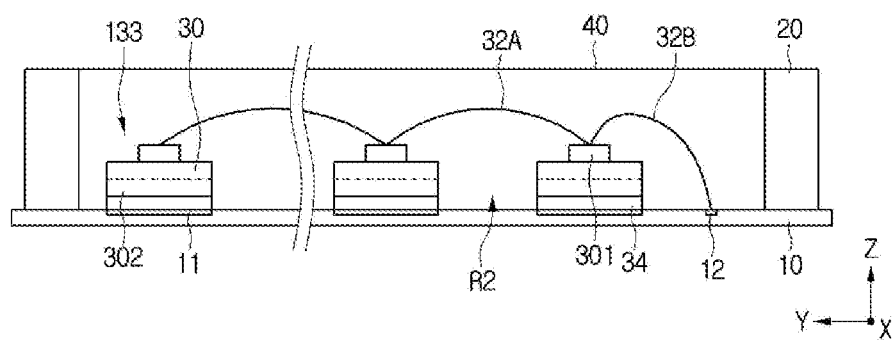
FIG. 12 is a side sectional view illustrating the light source module of FIG. 11.

FIG. 11 is a plan view illustrating a light source module according to a second embodiment, and FIG. 12 is a side sectional view illustrating the light source module of FIG. 11. In description of the second embodiment, configurations thereof identical to those of the first embodiment will refer to the description of the first embodiment.

Referring to FIGS. 11 and 12, the light source module includes: a flexible printed circuit board 10; a reflective member 20 that is arranged on a circumference of a light emitting area on the flexible printed circuit board 10; a plurality of light emitting chips 30 that are arranged within the reflective member 20; and a mold member 40 that covers the plurality of light emitting chips 30.

The plurality of light emitting chips 30 are mounted on the flexible printed circuit board 10. The plurality of light emitting chips 30 may be arranged in a matrix structure and, for example, may include first arrays 131 that are arranged in a first direction X and second arrays 133 that are arranged in a second direction Y that is different from the first direction X.

Figure 13:
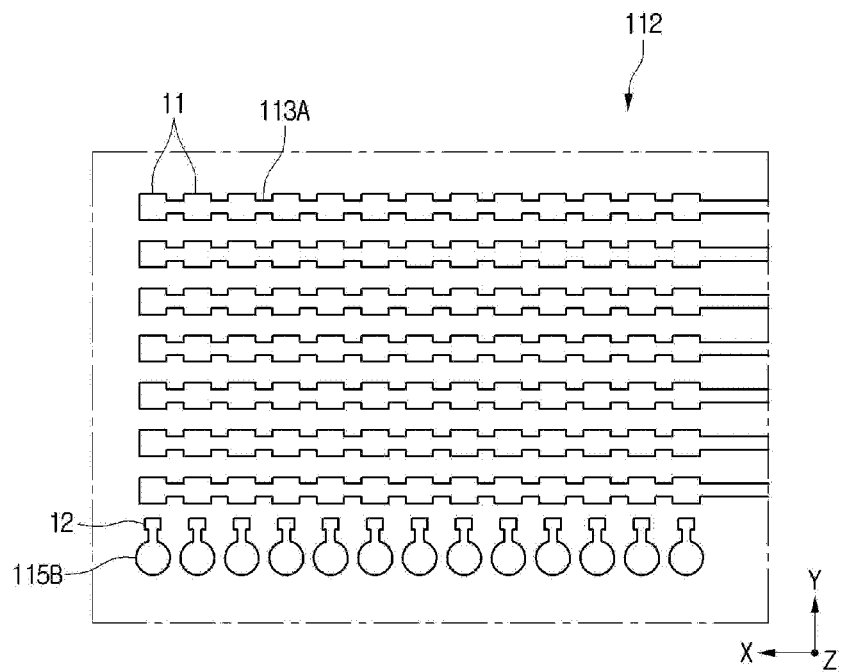
FIG. 13 is a view illustrating a circuit pattern of a first wiring layer on a substrate of the light source module of FIG. 11.

First electrodes 301 of light emitting chips 30 in each second array 133 are connected to each other by a first connection member 32A, and the last light emitting chip is connected to a second pad 12 by a second connection member 32B. The first connection member 32a interconnects the chips, making possible to remove a short-circuiting problem resulting from a difference between heights at opposite ends of a wire. As illustrated in FIG. 13, the second pad 12 may be connected to a second wiring layer through a via 115B.

A second electrode 302 of each light emitting chip 30 is bonded to a first pad 11 of the flexible printed circuit board 10 through a bonding material 34. The first electrodes 301 of the light emitting chips 30 in the second array 133 may be connected to each other, and second electrodes 302 are separated from each other.

As illustrated in FIG. 13, the light emitting chips 30 in the first array 131 may be connected to each other by a first connection pattern 113A of the first wiring layer 112. That is, the second electrodes 302 of the light emitting chips 30 in the first array 131 may be connected to each other through the first pad 11.

FIG. 13 is a view illustrating a first wiring layer of the flexible printed circuit board 10 of the light source module of FIG. 12. Referring to FIG. 13, in the first wiring layer 112, a plurality of first pads 11 arranged in the first direction are connected to each other through the first connection pattern 113A. Second pads 12 may be spaced apart from each other and may be connected to a second wiring layer through a via 115B. Accordingly, the second electrodes of the light emitting chips 30 in the first array 131 are connected to each other, and the first electrodes are separated from each other.

The light emitting chips 30 and wires, which are the first and second connection members 32A and 32B, are arranged in a direction of the second arrays 133, that is, in the second direction. Accordingly, when the flexible printed circuit board 10 is bent, a second stress applied in the second direction Y increases larger than a first stress in the first direction.

Further, the second stress is increased by the first and second connection members 32A and 32B, and the first stress may be equal to that of the first embodiment.

Figure 14:
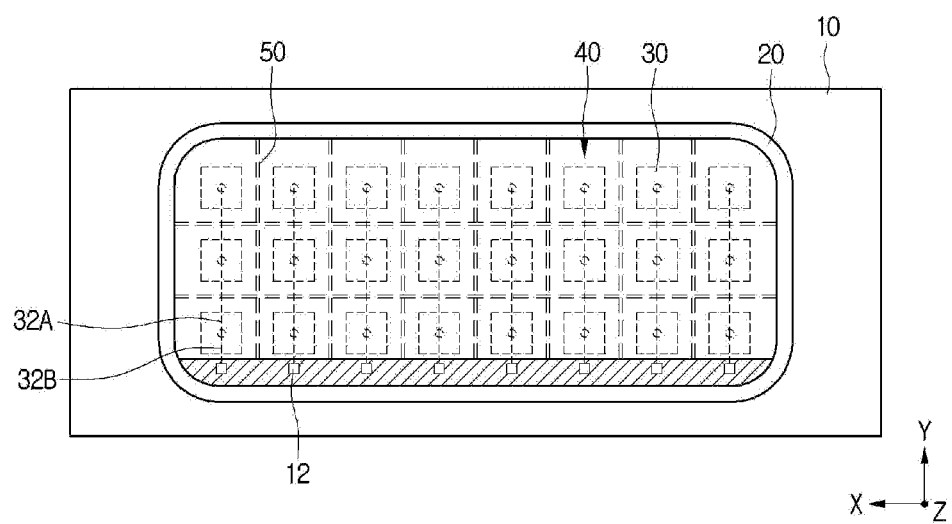
FIG. 14 is a plan view illustrating a light source module according to a third embodiment.
Figure 15:
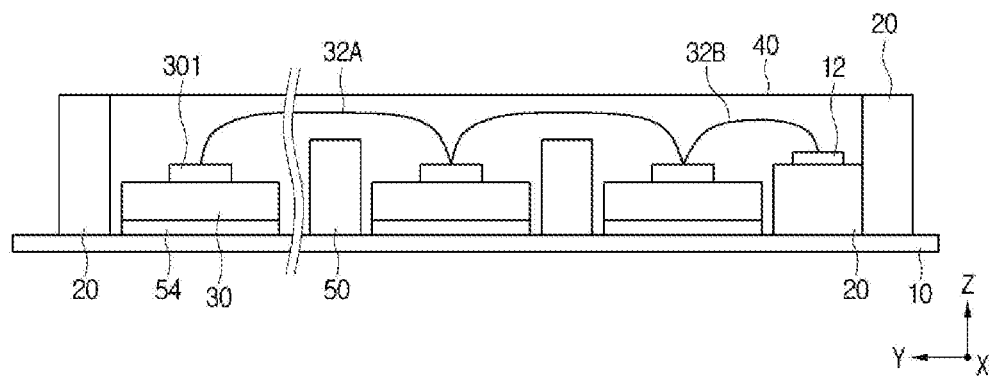
FIG. 15 is a side sectional view illustrating the light source module of FIG. 14.

FIG. 14 is a plan view illustrating a light source module according to a third embodiment, and FIG. 15 is a side sectional view illustrating the light source module of FIG. 14. In description of the third embodiment, configurations thereof identical to those of the first and second embodiments will refer to the description of the first and second embodiments.

Referring to FIGS. 14 and 15, the light source module includes: a flexible printed circuit board 10; a reflective member 20 that is arranged on a circumference of a light emitting area on the flexible printed circuit board 10; a plurality of light emitting chips 30 that are arranged within the reflective member 20; a mold member 40 that covers the plurality of light emitting chips 30; and blocking walls 50 that are arranged between the light emitting chips 30.

The blocking walls 50 may prevent interference of light generated by adjacent light emitting chips 30. Upper surfaces of the blocking walls 50 may be arranged lower than an upper surface of the reflective member 20. The blocking walls 50 may be arranged lower than highest points of the first and second connection members 32A and 32B. The mold member 40 molds the blocking walls 50 and the light emitting chips 30. The blocking walls 50 may be formed of a light reflection material, for example, solder resist or cover lay, but the present disclosure is not limited thereto.

The blocking walls 50 may be arranged in at least one direction among the first direction and the second direction, but the present disclosure is not limited thereto.

Second pads 12 are arranged on some of the blocking walls 50, and the second pads 12 and the light emitting chips 30 are connected to each other by second connection members 32B, respectively. The second pads 12 are arranged on the blocking walls 50, so that a tensile force resulting from a difference between heights at opposite ends of each second connection member 32B may be reduced. That is, a problem that the second connection members 32B are broken may be prevented. Each blocking wall 50 may have a structure in which a lower portion thereof is wide and an upper portion thereof is narrow or in which an outer side wall is inclined. Such a structure of the blocking wall 50 may improve reflection efficiency of light.

Figure 16:
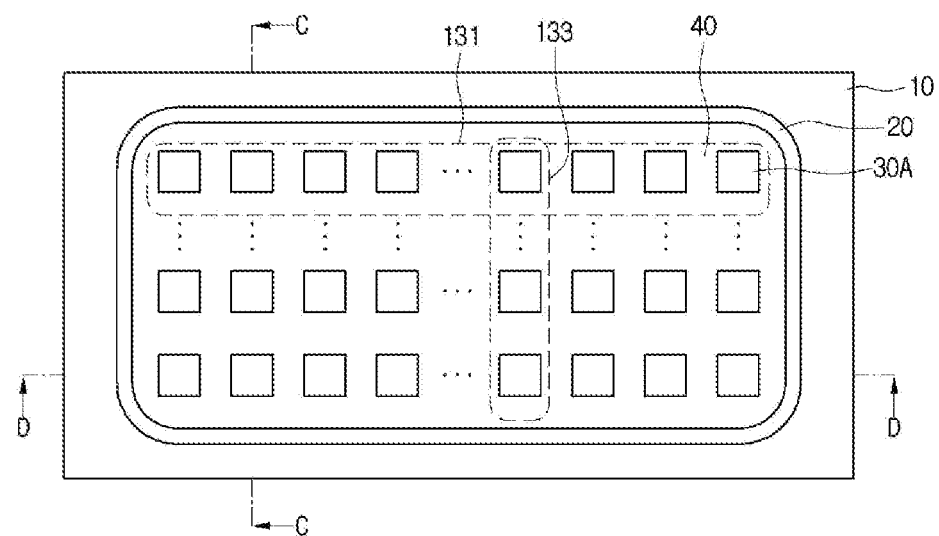
FIG. 16 is a plan view illustrating a light source module according to a fourth embodiment.
Figure 17:
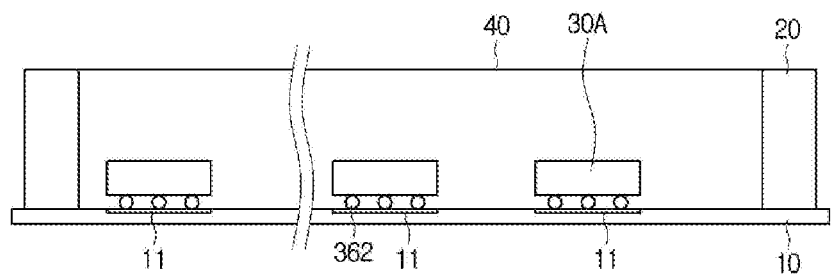
FIG. 17 is a sectional view illustrating the light source module of FIG. 16, taken along line C-C of FIG. 16.
Figure 18:
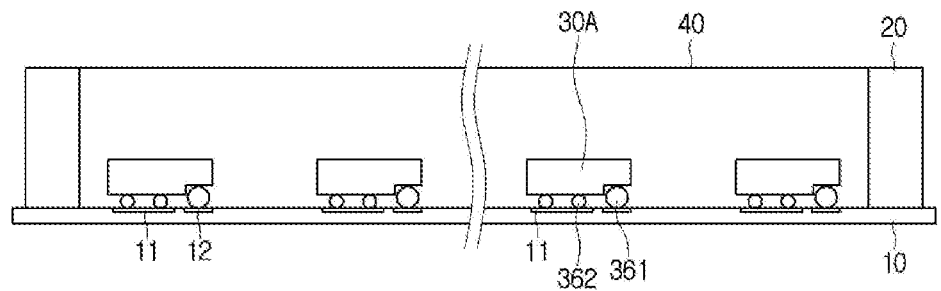
FIG. 18 is a sectional view illustrating the light source module of FIG. 16, taken along line D-D of FIG. 16.

FIG. 16 is a plan view illustrating a light source module according to a fourth embodiment, FIG. 17 is a sectional view illustrating the light source module of FIG. 16, taken along line C-C of FIG. 16, and FIG. 18 is a sectional view illustrating the light source module of FIG. 16, taken along line D-D of FIG. 16. In description of the fourth embodiment, configurations identical to those of the above-described embodiments will refer to the description of the above-described embodiments.

Referring to FIGS. 16 to 18, in the light source module, a plurality of light emitting chips 30A are mounted on a flexible printed circuit board 10 in a flip scheme. Each light emitting chip 30A is connected to the flexible printed circuit board 10 by first and second bonding members 361 and 362. For example, the light emitting chip 30A is connected to a first pad 11 of the flexible circuit board 10 by the first bonding member and is connected to a second pad 12 of the flexible circuit board 10 by the second bonding member 362. The light emitting chip 30A is mounted in a flip scheme, so that light extraction efficiency may be improved.

Figure 19:
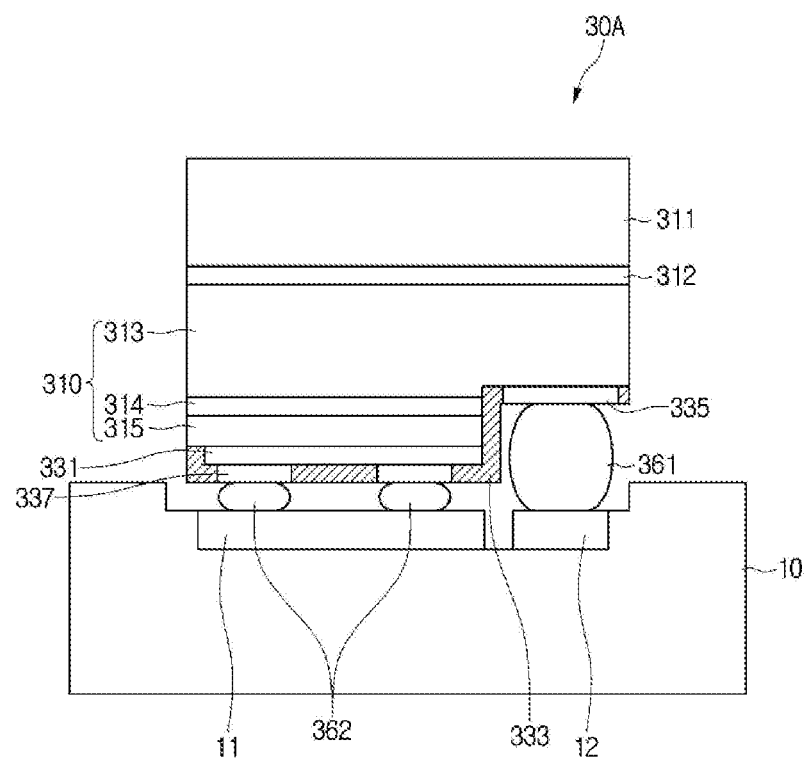
FIG. 19 is a view illustrating a flexible printed circuit board and a light emitting chip of the light source module of FIGS. 17 and 18.

FIG. 19 is a view illustrating the light emitting chip 30A of FIG. 16. Referring to FIG. 19, the light emitting chip 30A is bonded to the first and second pads 11 and 12 of the flexible printed circuit board 10 by the first and second bonding members 361 and 362. The first and second bonding members 361 and 362 may be some materials among solder, solder ball, bump and solder paste.

The light emitting chip 30A includes a substrate 311, a first semiconductor layer 312, a light emitting structure 310, an electrode layer 331, an insulating layer 333, a first electrode 335 and a second electrode 337.

A light-transmitting, insulating, or conductive substrate may be used as the substrate 311, and the substrate 311 may be formed of at least one of, for example, $Al_2O_3$, SiC, Si, GaAs, GaN, ZnO, Si, GaP, InP, Ge and $Ga_2O_3$. A plurality of blocking parts (not illustrated) are formed on a top surface of the substrate 311, so that light extraction efficiency may be improved. Here, the substrate 311 may be removed from the light emitting chip 30A. In this case, the first semiconductor layer 312 or a first conductive semiconductor layer 313 may be arranged on a top layer. The light emitting chip 30A extracts light through the entire upper surface of the substrate 311, so that light extraction efficiency may be improved.

The first semiconductor layer 312 may be formed below the substrate 311. The first semiconductor layer 312 may be formed using a compound semiconductor of group II-V atoms. The first semiconductor layer 312 may include at least one of, for example, GaN, InN, InGaN, AlGaN, InAlGaN, AlInN, AlGaAs, GaP, GaAs, GaAsP, AlGaInP and GaP. The first semiconductor layer 312 may be at least one of a buffer layer and an undoped semiconductor layer, the buffer layer may reduce a difference between lattice constants of the substrate and a nitride semiconductor layer, and the undoped semiconductor layer may improve crystal quality of a semiconductor. Here, the first semiconductor layer 312 may not be formed.

The light emitting structure 310 may be formed on the first semiconductor layer 312. The light emitting structure 310 may be selected from compound semiconductors of group II to V atoms and group III-V atoms, and may emit light of a predetermined peak wavelength within a wavelength range of an ultraviolet band to a visible light band.

The light emitting structure 310 includes a first conductive semiconductor layer 313, a second conductive semiconductor layer 315, and an active layer 314 formed between the first conductive semiconductor layer 313 and the second conductive semiconductor layer 315.

An electrode layer 331 is formed below the second conductive semiconductor layer 315. The electrode layer 331 includes a reflective layer, and the reflective layer may further include an ohmic layer that is in contact with the light emitting structure 310. The reflective layer may be selected from metals such as Al, Ag, Ru, Pd, Rh, PT and Ir, which have reflexibility of 70% or higher, or an alloy of two or more of the metals. Further, the electrode layer 331 may include a stack structure of a light-transmitting electrode layer/a reflective layer. A light extraction structure such as roughness may be formed on a surface of at least one layer among the second conductive semiconductor layer 315 and the electrode layer 331, and such a light extraction structure may change a critical angle of incident light to improve light extraction efficiency.

The first electrode 335 is arranged below a portion of the first conductive semiconductor layer 313, and the second electrode 337 may be arranged below a portion of the electrode layer 331.

The first electrode 335 may be electrically connected to the first conductive semiconductor layer 315 and the first bonding member 361, and the second electrode 337 may be electrically connected to the second conductive semiconductor layer 315 and the second bonding member 362 through the electrode layer 331. The first electrode 335 and the second electrode 337 may be formed of at least one of Cr, Ti, Co, Ni, V, Hf, Ag, Al, Ru, Rh, Pt, Pd, Ta, Mo and W or an alloy thereof. The first electrode 335 and the second electrode 337 may have the same stack structure or different stack structures.

The insulating layer 333 may be arranged below the electrode layer 331, and may be arranged on a lower surface of the second conductive semiconductor layer 315, on side surfaces of the second conductive semiconductor layer 315 and the active layer 314, and a portion of the first conductive semiconductor layer 313. The insulating layer 333 is formed on a lower region of the light emitting structure 310 except for the electrode layer 331, the first electrode 335, and the second electrode 337, to electrically protect a lower portion of the light emitting structure 310. The insulating layer 333 may include an insulating material or insulating resin formed of at least one of an oxide, a nitride, a fluoride, and a sulfide having at least one of Al, Cr, Si, Ti, Zn and Zr. The insulating layer 333 may be formed selectively of, for example, $SiO_2$, $Si_3N_4$, $Al_2O_3$ and $TiO_2$. The insulating layer 333 is formed to prevent interlayer short-circuiting of the light emitting structure 310 when a metal structure for flip bonding is formed below the light emitting structure 310.

Light generated by the light emitting chip 30A may be reflected by the electrode layer 331 and may be emitted through the substrate 331.

Figure 20:
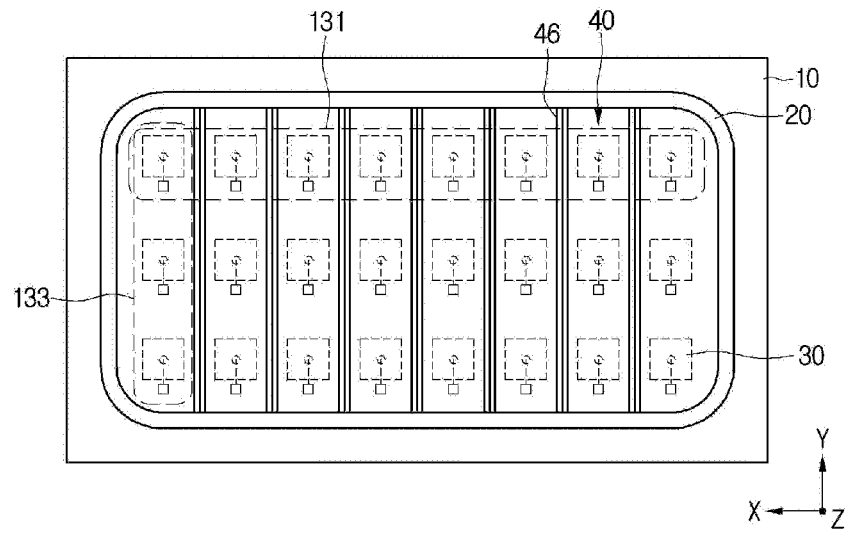
FIG. 20 is a plan view illustrating a light source module according to a fifth embodiment.
Figure 21:
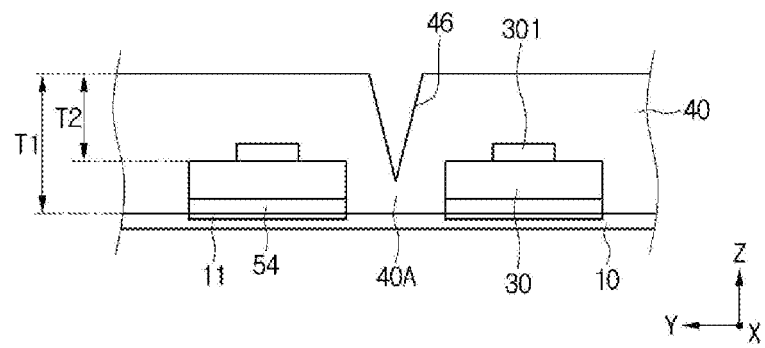
FIG. 21 is a partially sectional view illustrating the light source module of FIG. 20.

FIG. 20 is a view illustrating a light source module according to a fifth embodiment, and FIG. 21 is a side sectional view illustrating the light source module of FIG. 20. In description of the fifth embodiment, configurations identical to those of the above-described embodiments will refer to the description of the above-described embodiments.

Referring to FIGS. 20 and 21, the light source module includes: a flexible printed circuit board 10; a reflective member 20 that is arranged on a circumference of a light emitting area on the flexible printed circuit board 10; a plurality of light emitting chips 30 that are arranged within the reflective member 20; and a mold member 40 that covers the plurality of light emitting chips 30 and has grooves 46 formed therein.

The mold member 40 has the grooves 46 that are arranged between second arrays 133, and each groove 46 may have a side section surface of a polygonal shape, for example, including a triangular shape or a quadrangular shape. The groove 46 may be concave from an upper surface of the mold member 40 and may be arranged in at least one direction among first and second directions.

A depth T2 of the groove 46 may be formed thinner than a thickness T1 of the mold member 40.

The groove 46 is arranged between light emitting chips 30 in each first array 131, making possible to reflect light generated by the light emitting chips 30. Further, a stress when the flexible printed circuit board 10 is bent with respect to the first direction X may be reduced. Because a portion 40A of the mold member 40 exists between the groove 46 and the flexible printed circuit board 10, a restoring force of the flexible printed circuit board 10 may be changed based on the depth T2 of the groove 46.

As another example, the grooves 46 may be arranged within the mold member 40 to intersect each other, but the present disclosure is not limited thereto.

Figure 22:
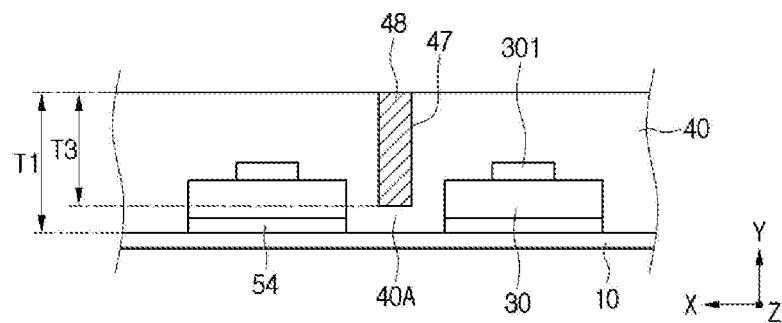
FIG. 22 is a side sectional view illustrating another example of the light source module of FIG. 21.

In FIG. 22, each groove 47 of a polygonal shape is arranged within the mold member 40 and is filled with a reflective material 48. The reflective material 48 may reflect light generated by the light emitting chips 30. A depth T3 of the groove 47 may be formed thinner than the thickness T1 of the mold member 40. The reflective material 40 may be obtained by adding a reflection agent to a resin material, for example, soft silicone, and the reflection agent may include $TiO_2$ or $SiO_2$.

Figure 23:
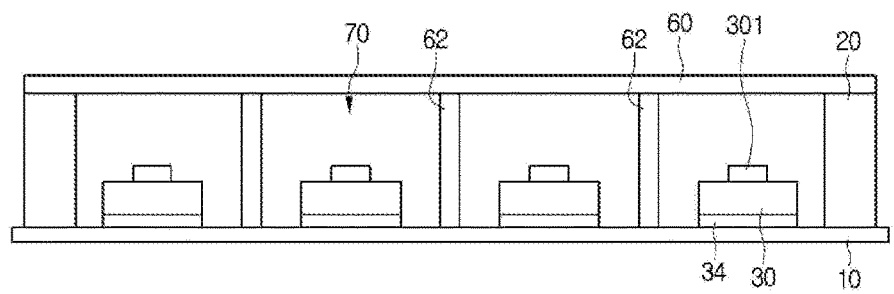
FIG. 23 is a side sectional view illustrating a light source module according to a sixth embodiment.

FIG. 23 is a side sectional view illustrating a light source module according to a sixth embodiment.

Referring to FIG. 23, in the light source module, a plurality of light emitting chips 30 are arranged on a flexible printed circuit board 10, blocking walls 62 are arranged between the plurality of light emitting chips 30, and a light-transmitting film 60 are arranged on the blocking walls 62. The light-transmitting film 60 is bonded to the plurality of light emitting chips 30 and a reflective member 20 to protect the plurality of light emitting chips 30. The light-transmitting film 60 may include a light-transmitting material such as polyimide.

The blocking walls 62 may function as members that reflect light and prevent the light-transmitting film 60 from being deflected. The blocking walls 62 may be formed to have a column shape or a bar shape, but the present disclosure is not limited thereto.

Here, an area 70 between the flexible printed circuit board 10 and the light-transmitting film 60 may be filled with air not the mold member, but the present disclosure is not limited thereto.

Figure 24:
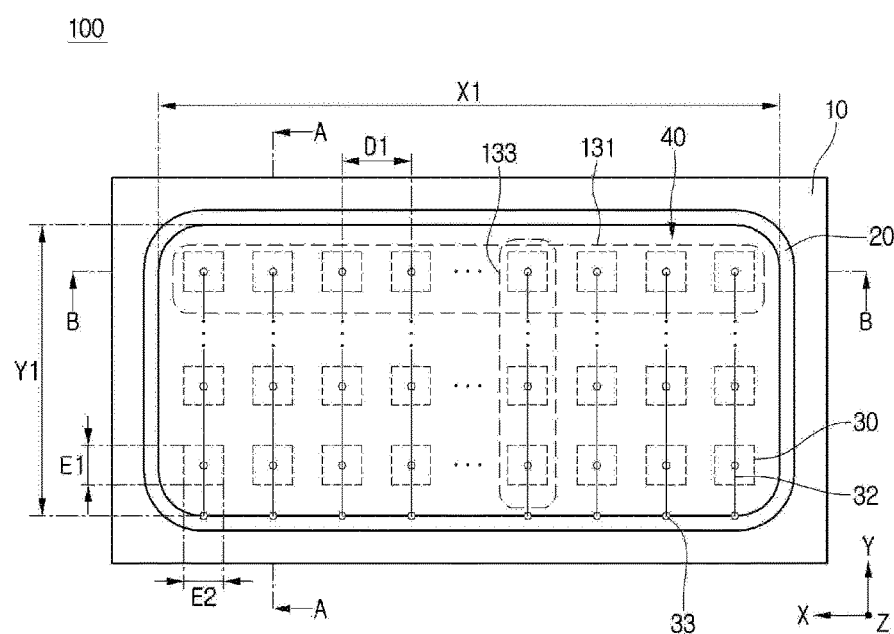
FIG. 24 is a plan view illustrating a light source module according to a seventh embodiment.
Figure 25:
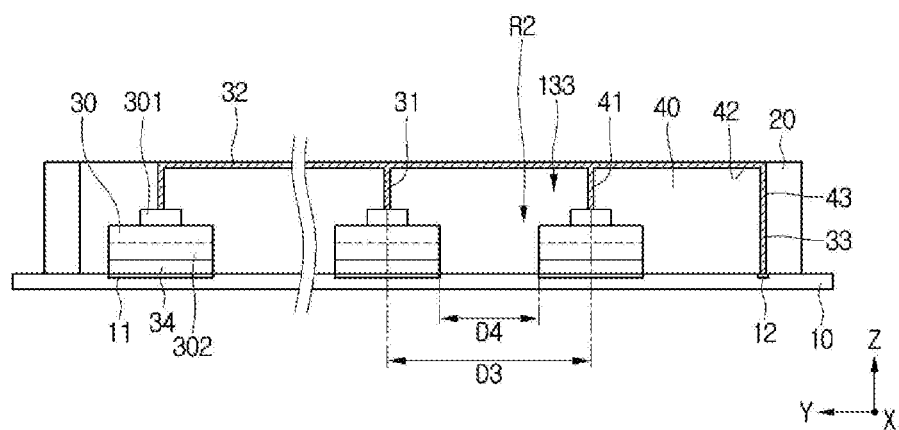
FIG. 25 is a sectional view illustrating the light source module of FIG. 24, taken along line A-A of FIG. 24.
Figure 26:
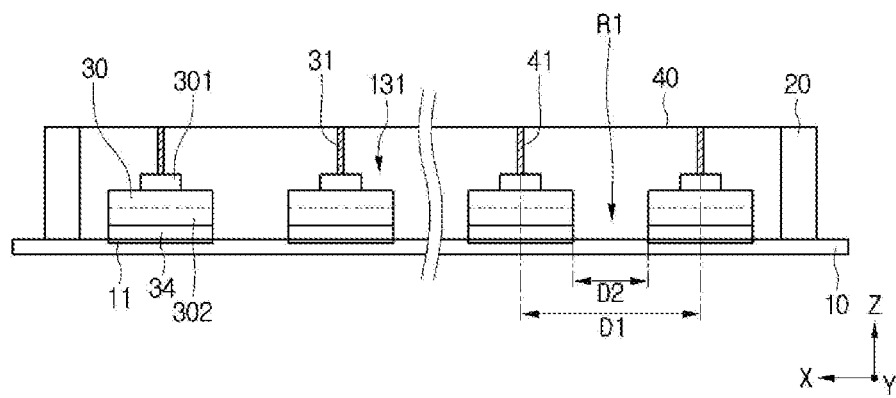
FIG. 26 is a sectional view illustrating the light source module of FIG. 24, taken along line B-B of FIG. 24.

FIG. 24 is a plan view illustrating a light source module according to a seventh embodiment, FIG. 25 is a sectional view illustrating the light source module of FIG. 24, taken along line A-A of FIG. 24, and FIG. 26 is a sectional view illustrating the light source module of FIG. 24, taken along line B-B of FIG. 24. Configurations identical to those of the above-described embodiments will refer to the description of the above-described embodiments.

Referring to FIGS. 24 to 26, the light source module 100 includes a flexible printed circuit board 10, a reflective member 20 that is arranged on a circumference on the flexible printed circuit board 10, a plurality of light emitting chips 30 that are arranged on the flexible printed circuit board 10, a mold member 40 that covers the light emitting chips 30 on the flexible printed circuit board 10, first connection layers 31 that are connected to the light emitting chips 30, respectively, and second connection layers 32 that are arranged on the mold member 40 and are connected to the first connection layers 31.

The plurality of light emitting chips 30 are mounted on the flexible printed circuit board 10. The plurality of light emitting chips 30 may be arranged in a matrix structure. The light emitting chips 30 may include, for example, a plurality of first arrays 131 that are arranged in a first direction and a plurality of second arrays 133 that are arranged in a second direction Y that is different from the first direction X. The first direction X and the second direction Y may be perpendicular to each other.

The plurality of first arrays 131 are arranged in a row direction or a transverse direction, and the plurality of second arrays 133 are arranged in a column direction or a longitudinal direction. The number of the second arrays 133 may be 1.5 times larger than, for example, two times larger than, the number of the first arrays 131. A light emitting area in which the light emitting chips 30 are arranged may be arranged such that a length X1 thereof in the first direction X is 1.5 times larger than, for example, two times larger than, a length Y1 thereof in the second direction Y. Because the length X1 thereof in the first direction X is larger, the flexible printed circuit board 10 may be easily bent with respect to the first direction X.

The number of light emitting chips 30 arranged in each first array 131 is larger than the number of light emitting chips 30 arranged in each second array 133. For example, the number of the light emitting chips 30 arranged in the first array 131 may be 1.5 times larger than, for example, two times larger than the number of the light emitting chips 30 arranged in the second array 133. In an embodiment, the length X1 of the light emitting area of the flexible printed circuit board 10 in the first direction 10 is larger than the length Y1 thereof in the second direction Y, so that the flexible printed circuit board 10 may be effectively used while being bent with respect to the first direction X.

The first connection layers 31 are connected to the light emitting layers 30, respectively. The plurality of first connection layers 31 are connected to first electrodes 301 of the light emitting chips 30, respectively. The first connection layers 31 are arranged between an upper surface of the mold member 40 and the light emitting chips 30. The first connection layers 31 are arranged in a direction perpendicular to the upper surface of the mold member 40.

The second connection layers 32 are connected between third connection layers 33 and a second pad 12 of the flexible printed circuit board 10, respectively. The second pad 12 may be arranged on an outer area of the flexible printed circuit board 10 or may be arranged in an area adjacent to the reflective member 20. The third connection layers 33 may be in contact with an inner surface of the reflective member 20 or may be embedded in the reflective member 20.

As illustrated in FIGS. 24 and 25, the second connection layers 32 are connected to the plurality of first connection layers 31. The plurality of second connection layers 32 are spaced apart from each other in the first direction X. The plurality of second connection layer 32 extend in a direction of the second arrays 133 and are connected to the first connection layers 31 connected to the light emitting chips 30 of the second arrays 133. The second connection layers 32 are arranged on the mold member 40.

The light emitting chips 30 of the second arrays 133 are connected to the plurality of first connection layers 31, respectively, and the plurality of first connection layers 31 are connected to the second connection layers 32. The first to third connection layers 31, 32 and 33 include conductive wires, and the conductive wires include a conductive oxide, a metal wire or a metallic wire. The conductive wires may be selected from a metal, a metal oxide and a metal nitride, and may be formed of a material consisting of one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), Ag, Ni, Al, Rh, Pd, Ir, Ru, Mg, Zn, Pt, Au and Hf and a selective combination thereof. As another example, the conductive wires include graphene, carbon fiber or carbon nano-tube. The first to third connection layers 31, 32 and 33 may include a light-transmitting material.

Figure 27:
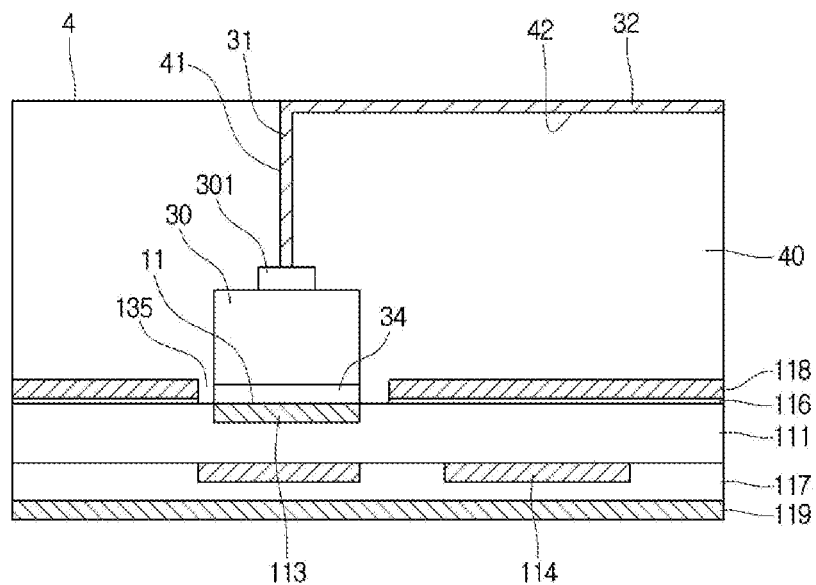
FIG. 27 is a detailed view illustrating a substrate of the light source module of FIG. 25.

As illustrated in FIGS. 25 and 27, the mold member 40 is arranged on the flexible printed circuit board 10 to cover the light emitting chips 40. The mold member 40 is arranged within the reflective member 20. The mold member 40 includes a plurality of first and second holes 41 and 43 and a plurality of grooves 42, the first holes 41 are arranged on the light emitting chips 30, respectively, and the first connection layers 31 are arranged in the first holes, respectively. The second holes 43 are arranged in areas corresponding to the second pad 12 of the flexible printed circuit board 10, and the third connection layers 33 are arranged in the second holes 43, respectively.

The grooves 42 is recessed lower than an upper surface of the mold member 40, and is arranged to vertically overlap the plurality of light emitting chips 30 arranged in a direction of the first arrays 131. The second connection layers 32 are arranged in the grooves 42, respectively. Upper surfaces of the second connection layers 32 may be arranged in a horizontal surface lower than or identical to the upper surface of the mold member 40. As another example, the upper surfaces of the second connection layers 32 may protrude from the upper surface of the mold member 40.

As illustrated in FIG. 24, transverse and longitudinal lengths E1 and E2 of each light emitting chip 30 may be identical to or different from each other, and at least one of the transverse and longitudinal lengths E1 and E2 may be not more than 500 μm, for example, not more than 300 μm.

Referring to FIGS. 24 and 25, the second connection layers 32 together with the light emitting chips 30 are arranged along a second region R2 in a second direction. Thus, when the flexible printed circuit 10 is bent with respect to the second direction Y, a generated second stress may be larger applied due to the light emitting chips 30 and the second connection layers 32.

Further, as illustrated in FIGS. 24 and 26, because the second connection layers 32 as illustrated in FIG. 2 are not arranged in regions R1 between the light emitting chips 30 of the first arrays 131, a first stress generated when the flexible printed circuit board 10 is bent with respect to the first direction X may be smaller than the second stress. Further, the second connection layers 32 extend to overlap the light emitting chips 30 in the second direction, and thus, the second stress may be larger applied in the second direction Y, but may be applied in the first direction X as a stress having a form of one line. Accordingly, the flexible printed circuit board 10 may be easily bent in the first direction X. In the flexible printed circuit board 10 according to the embodiment, a length thereof in the first direction X is 1.5 times larger than, for example, two times larger than a length thereof in the second direction Y, so that a stress at bending in the first direction X may be reduced.

As illustrated in FIGS. 25 and 26, an interval D4 and a period D3 between the light emitting chips 30 in the second array 133 may be larger or equal to an interval D2 and a period D1 between the light emitting chips 30 in each first array 131. At least one of the intervals D2 and D4 may be formed larger than at least one of the transverse and longitudinal lengths of each light emitting chip 30, and for example, includes a range of 0.3 mm to 0.7 mm. Such intervals D2 and D4 may be changed based on the size of the light emitting chip 30.

As illustrated in FIG. 27, the flexible printed circuit board 10 includes an insulating film 111, a first wiring layer 113, a second wiring layer 114, a first cover lay 118 and a second cover lay 119, and the insulating film 111 may include a polyimide film or various insulating films formed of polyester, polyethylene or the like may be used as the insulating film 111. The insulating film 111 has a thickness of 70 μm or less, for example, a range of 10 μm to 40 μm, but the present disclosure is not limited thereto. When the thickness of the insulating film 111 exceeds the range, bending is difficult, and when the thickness thereof is smaller than the range, elasticity after bending is reduced.

The first wiring layer 113 is attached on an upper surface of the insulating film 111, and the second wiring layer 114 is attached on a lower surface of the insulating film 111. When the first and second wiring layers 113 and 114 are attached, a desired pattern may be formed through etching. The second wiring layer 144 may be omitted, but the present disclosure is not limited thereto.

The first and second wiring layers 113 and 114 may be attached to each other by an adhesive layer 116 or may be manufactured integrally with the insulating film 111 by applying polymer resin to the first and second wiring layers 113 and 114, and then curing them. The first cover lay 118 is bonded to the first wiring layer 112 through the adhesive layer 116 to protect the first wiring layer 118. An open area 135 may be formed on the first cover lay 118, and the first and second pads 11 and 12 of the first wiring layer 112 may be exposed to the open area 135, as illustrated in FIG. 2. The first pad 11 may be exposed to an area corresponding to an area of a lower surface of the light emitting chip 30.

The second cover lay 119 is bonded through an adhesive layer 117 to protect the second wiring layer 114. The first and second cover lays 118 and 119 may be formed of a transparent film or solder resist, but the present disclosure is not limited thereto.

Meanwhile, as illustrated in FIGS. 24 to 26, the reflective member 20 is arranged on an outer circumference of an upper surface of the flexible printed circuit board 10. The reflective member 20 may be formed to have a consecutively connected frame shape. The reflective member 20 may reflect light that is emitted from the light emitting chips 30, on the circumference of the light emitting chips 30. The reflective member 20 may include materials such as silicone and epoxy, or may include materials such as solder resist or a mask material. A surface of the reflective member may be coated with a plating layer. The reflective member 20 may be white, silver or black, but the present disclosure is not limited thereto.

The reflective member 20 is arranged on a circumference of the mold member 40. The reflective member 20 may serve as a dam that prevents the mold member 40 from being overflowed.

The mold member 40 may be formed of a soft mold material, and for example, may be formed of soft silicone. The mold member 40 is expanded when the flexible printed circuit board 10 is bent at a predetermined curvature, and is restored when the flexible printed circuit board 10 is restored. Here, the mold member 40 is molded on the light emitting chips 30, thereby increasing the second stress in the second arrays 133. Accordingly, the bending and the restoring in an arrangement direction of the first arrays 131 may be facilitated.

The mold member 40 may include a light-transmitting material. The light transmitting material emits light that is emitted from the light emitting chips 30. The mold member 40 may include fluorescent substances. The fluorescent substances may convert a portion of the light emitted from the light emitting chips 30. The light emitting chips 30 may emit at least one of ultraviolet rays, blue light, red light, green light and white light. The fluorescent substances may include at least one of red, yellow, green and blue fluorescent substances. As another example, individual fluorescent substance layers may be arranged on each light emitting chip 30 to convert a wavelength of the light emitted from the light emitting chips 30. In this case, the mold member 40 may not be formed or may be provided as a clean molding material not having fluorescent substances.

As illustrated in FIG. 5, the light emitting chip 30 includes the first electrode 301, the light emitting structure 310, the second electrode 302 below the light emitting structure 310, and the protective layer 323 on the circumference of the lower surface of the light emitting structure 310.

However, as illustrated in FIGS. 25 to 27, the second electrode 302 in the present embodiment may be connected to the second pad 12 of the flexible printed circuit board 10 through a bonding member 34. Further, the first electrode 301 is arranged in the light emitting structure 310 and is connected to a first conductive semiconductor layer 313. Such a first electrode 301 is connected to a first connection layer 31 as illustrated in FIGS. 25 and 26.

Figure 28:
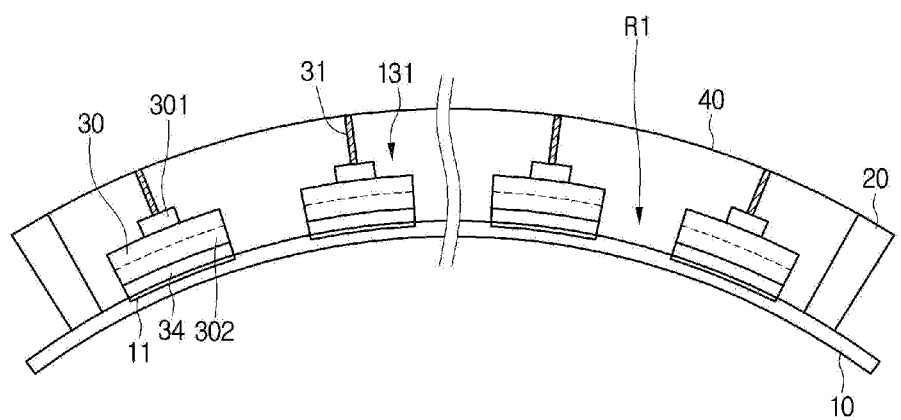
FIG. 28 is a view illustrating a bending direction of a flexible printed circuit board according to the seventh embodiment.
Figure 40:
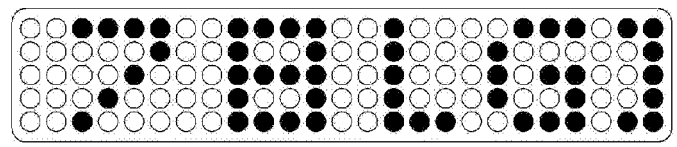
FIG. 40 is a view illustrating an information display state of the light source module according to the embodiment.

Referring to FIG. 28, the light source module 100 may be bent in a convex direction Z or a concave direction with respect to the first direction X. After being bent in a direction of the first arrays 131, a bending radius of the flexible printed circuit board 10 may be not more than 150 mm, for example, not more than 100 mm. Further, as illustrated in FIG. 40, the light source module 100 may be bent in a state in which the light emitting chips display information. Such a light source module 100 displays information as illustrated in FIG. 30, and may thus be provided as a display module.

Figure 29:
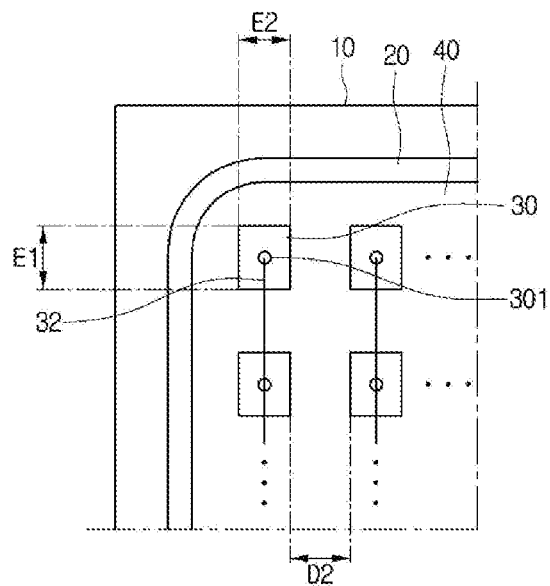
FIG. 29 is a view illustrating another example of the light source module of FIG. 24.

FIG. 29 illustrates an example where the transverse length E1 and the longitudinal length E2 of the light emitting chip 30 are different from each other in the light source module of FIG. 24. For example, because the transverse length E1 of the light emitting chip 30 is smaller than the longitudinal length E2 thereof, an interval D2 between the light emitting chips 30 may be further widened. Accordingly, a stress according to the bending of the flexible printed circuit board 10 may be smaller than that of the first embodiment.

Figure 30:
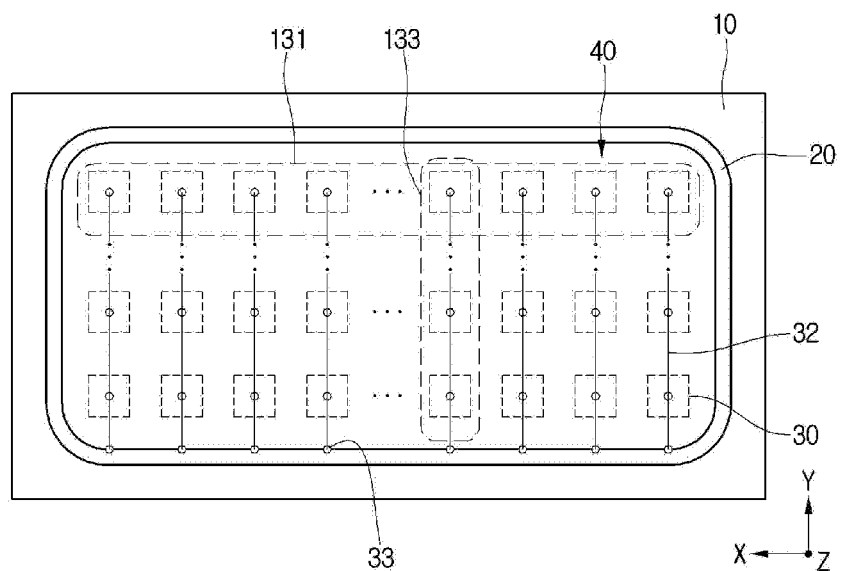
FIG. 30 is a plan view illustrating a light source module according to an eighth embodiment.
Figure 31:
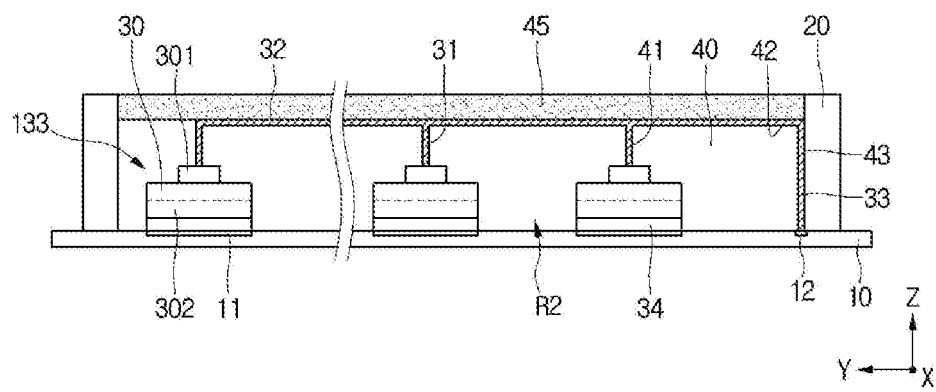
FIG. 31 is a side sectional view illustrating the light source module of FIG. 30.

FIG. 30 is a plan view illustrating a light source module according to an eighth embodiment, and FIG. 31 is a side sectional view illustrating the light source module of FIG. 30. In description of the eighth embodiment, configurations identical to those of the above-described embodiments will refer to the description of the above-described embodiments.

Referring to FIGS. 30 and 31, the light source module includes a flexible printed circuit board 10, a reflective member 20 that is arranged on a circumference of a light emitting area on the flexible printed circuit board 10, a plurality of light emitting chips 30 that are arranged within the reflective member 20, first connection layers 31 that are connected to the light emitting chips 30, respectively, second connection layers 32 that are connected to the first connection layers 31, third connection layers 33 that are connected between the second connection layers 32 and the flexible printed circuit board 10, respectively, a mold member 40 that covers the plurality of light emitting chips 30, and a light-transmitting layer 45 on the mold member 40.

The plurality of light emitting chips 30 are mounted on the flexible printed circuit board 10. The plurality of light emitting chips 30 may be arranged in a matrix structure, and for example, includes a plurality of first arrays 131 that are arranged in a first direction and a plurality of second arrays 133 that are arranged in a second direction Y that is different from the first direction X.

Second electrodes 302 of the light emitting chips 30 are bonded to a first pad of the flexible printed circuit board 10 through bonding members 34, respectively. First electrodes of light emitting chips 30 in each second array 133 are connected to each other by a second connection layer 32 through first connection layers 31.

The first to third connection layers 31, 32 and 33 are arranged on the mold member 40. The light-transmitting layer 45 may be arranged on the mold member 40. The light-transmitting layer 45 may include light-transmitting silicone or epoxy. The light-transmitting layer 45 serves to protect surfaces of the second connection layers 32 exposed to an upper surface of the mold member 40. Such a light-transmitting layer 45 may include fluorescent substances, but the present disclosure is not limited thereto. A height of the reflective member 20 is larger than the upper surface of the mold member 40 and is equal to or smaller than an upper surface of the light-transmitting layer 45.

Figure 32:
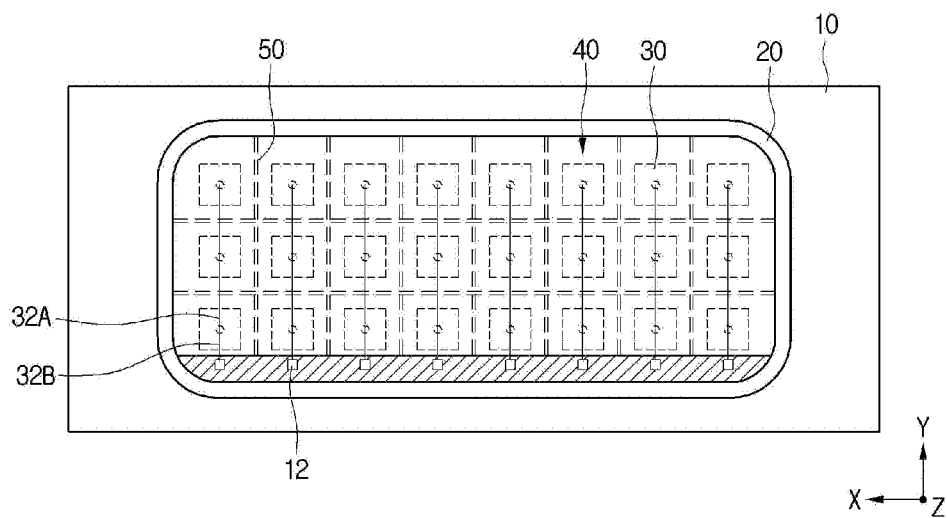
FIG. 32 is a plan view illustrating a light source module according to a ninth embodiment.
Figure 33:
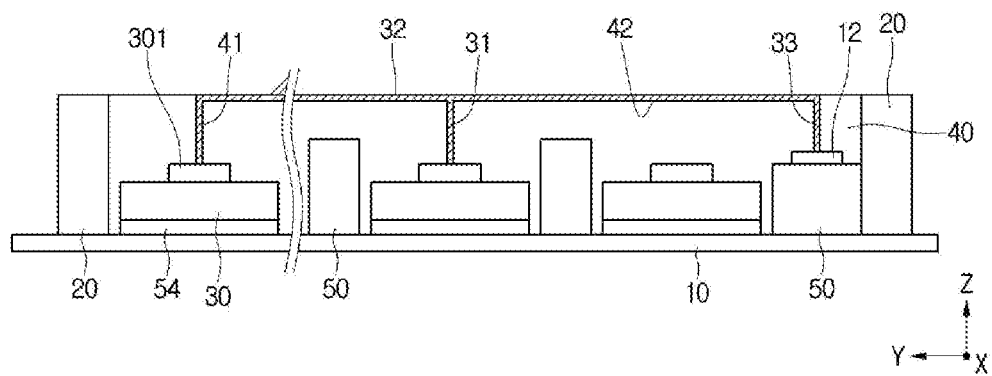
FIG. 33 is a side sectional view illustrating the light source module of FIG. 32.

FIG. 32 is a plan view illustrating a light source module according to a ninth embodiment, and FIG. 33 is a side sectional view illustrating the light source module of FIG. 32. In description of the ninth embodiment, configurations identical to the above-described embodiments will refer to the description of the above-described embodiments.

Referring to FIGS. 32 and 33, the light source module includes a flexible printed circuit board 10, a reflective member 20 that is arranged on a circumference of a light emitting area on the flexible printed circuit board 10, a plurality of light emitting chips 30 that are arranged within the reflective member 20, a mold member 40 that covers the plurality of light emitting chips 30, first connection layers 31 that are connected to the light emitting chips 30, second connection layers 32 that are connected to the first connection layers 31, third connection layers 33 that are connected between the second connection layers 32 and the flexible printed circuit board 10, respectively, and blocking walls 50 between the light emitting chips 30.

The blocking walls 50 may prevent interference of light generated by adjacent light emitting chips 30. Upper surfaces of the blocking walls 50 may be arranged lower than an upper surface of the reflective member 20. The blocking walls 50 may be arranged lower than the second connection layers 32. The mold member 40 molds the blocking walls 50 and the light emitting chips 30. The blocking walls 50 may be formed of a light reflection material, for example, solder resist or cover lay, but the present disclosure is not limited thereto.

The blocking walls 50 may be arranged in at least one direction among the first direction X and the second direction Y or may be arranged in the first and second directions X and Y, but the present disclosure is not limited thereto.

Second pads 12 connected to the flexible printed circuit board 10 are arranged on some of the blocking walls 50, and the second pads 12 and the light emitting chips 30 are connected to the third connection layers 33 that are connected to the second connection layers 32, respectively. Each blocking wall 50 may have a structure in which a lower portion thereof is wide and an upper portion thereof is narrow or in which an outer side wall is inclined. Such a structure of the blocking wall 50 may improve reflection efficiency of light.

Figure 34:
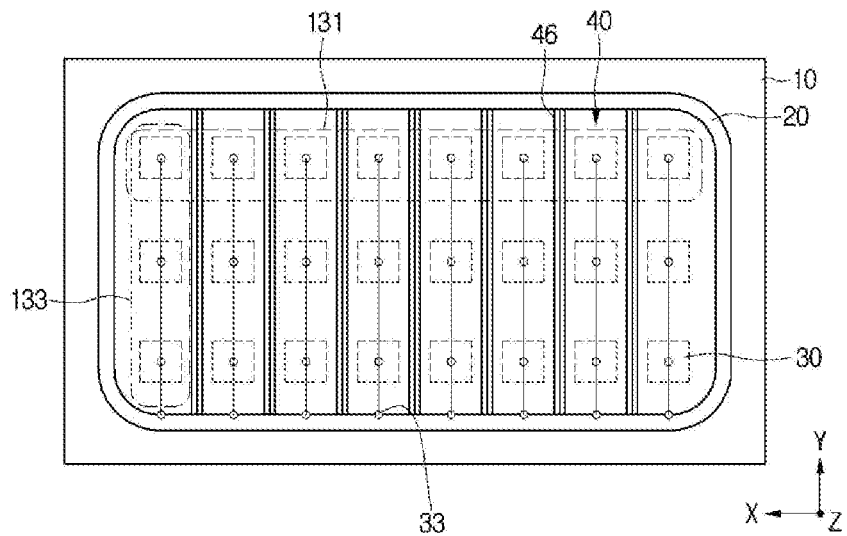
FIG. 34 is a plan view illustrating a light source module according to a tenth embodiment.
Figure 35:
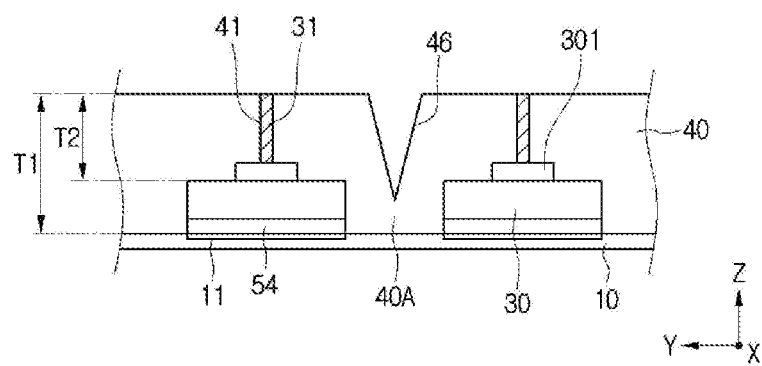
FIG. 35 is a partially sectional view illustrating the light source module of FIG. 34.

FIG. 34 is a view illustrating a light source module according to a tenth embodiment, and FIG. 35 is a side sectional view illustrating the light source module of FIG. 34. In description of the tenth embodiment, configurations identical to those of the above-described embodiments will refer to the descriptions of the above-described embodiments.

Referring to FIGS. 34 and 35, the light source module includes a flexible printed circuit board 10, a reflective member 20 that is arranged on a circumference of a light emitting area of the flexible printed circuit board 10, a plurality of light emitting chips 30 that are arranged within the reflective member 20, first connection layers 31 that are connected to the light emitting layers 30, respectively, second connection layers 32 that are connected to the first connection layers 31, respectively, third connection layers 33 that are connected between the second connection layers 32 and the flexible printed circuit board 10, respectively, and a mold member 40 that covers the plurality of light emitting chips 30 and has grooves 46 formed therein.

The mold member 40 has the grooves 46 that are arranged between second arrays 133, and each groove 46 may have a side section surface of a polygonal shape, for example, including a triangular shape or a quadrangular shape. The groove 46 may be concave from an upper surface of the mold member 40 and may be arranged in at least one direction among first and second directions X and Y or in the first and second directions X and Y.

A depth T2 of the groove 46 may be formed thinner than a thickness T1 of the mold member 40. The groove 46 is arranged between light emitting chips 30 in each first array 131 to reflect light generated by the light emitting chips 30. Further, a stress when the flexible printed circuit board 10 is bent with respect to the first direction X may be reduced. Because a portion 40A of the mold member 40 exists between the groove 46 and the flexible printed circuit board 10, a restoring force of the flexible printed circuit board 10 may be changed based on the depth T2 of the groove 46.

As another example, the grooves 46 may be arranged within the mold member 40 to intersect each other, but the present disclosure is not limited thereto.

The second connection layers 32 may be arranged along the upper surface of the mold member 40 and may be connected to the first and third connection layers 31 and 33.

Figure 36:
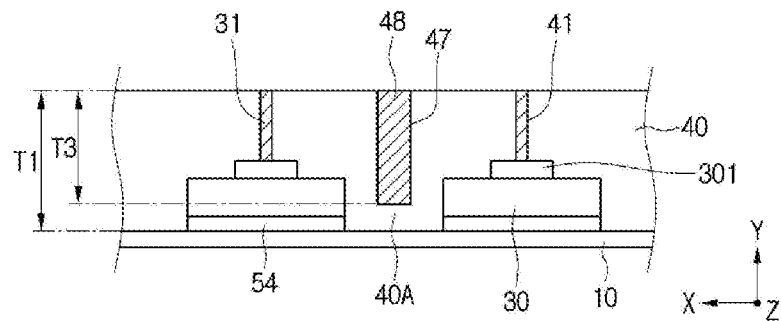
FIG. 36 is a side sectional view illustrating another example of the light source module of FIG. 35.

In FIG. 36, each groove 47 of a polygonal shape is arranged within the mold member 40 and is filled with a reflective material 48. The reflective material 48 may reflect light generated by the light emitting chips 30. A depth T3 of the groove 47 may be formed thinner than the thickness T1 of the mold member 40. The reflective material 40 may be obtained by adding a reflection agent to a resin material, for example, soft silicone, and the reflection agent may include $TIO_2$ or $SiO_2$.

Figure 37:
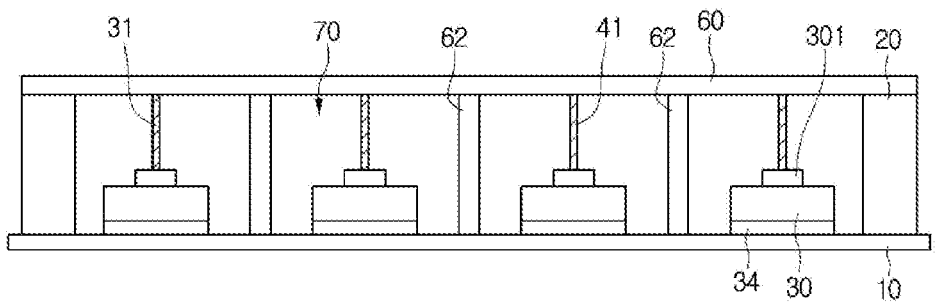
FIG. 37 is a side sectional view illustrating a light source module according to an eleventh embodiment.

FIG. 37 is a side sectional view illustrating a light source module according to an eleventh embodiment. In description of the eleventh embodiment, configuration identical to those of the above-described embodiments will refer to the description of the above-described embodiments.

Referring to FIG. 37, in the light source module, a plurality of light emitting chips 30 are arranged on a flexible printed circuit board 10, blocking walls 62 are arranged between the plurality of light emitting chips 30, and a light-transmitting film 60 is arranged on the blocking walls 62 and the mold member 40. First connection layers 41, and second and third connection layers that are not illustrated may be arranged in the mold member 40.

The light-transmitting film 60 is bonded to the plurality of light emitting chips 30 and the reflective member 20 to protect the plurality of light emitting chips 30. The light-transmitting film 60 may include a light-transmitting material such as polyimide.

The blocking walls 62 may function as members that reflect light and prevent the light-transmitting film 60 from being deflected. The blocking walls 62 may be formed to have a column shape or a bar shape, but the present disclosure is not limited thereto.

Figure 38:
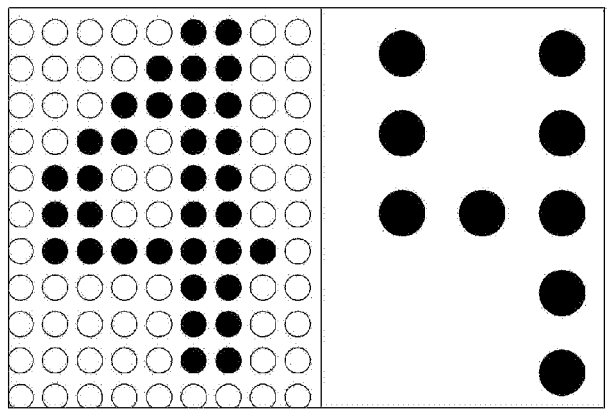
FIG. 38 is a view illustrating a comparison between resolutions of an embodiment and a comparative example in the same size.
Figure 39:
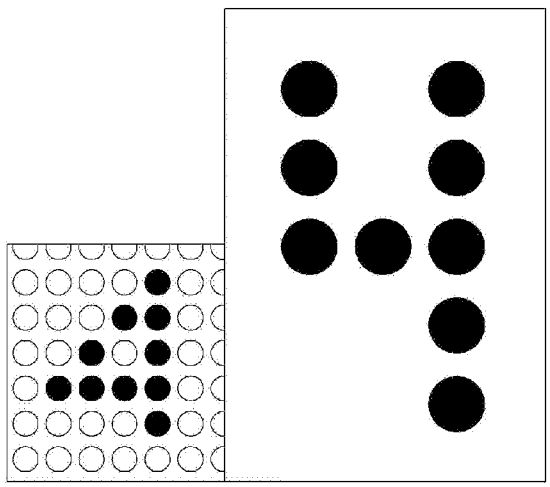
FIG. 39 is a view illustrating a comparison between sizes of the embodiment and the comparative example in the same number of light sources.

FIG. 38 illustrates a comparison between resolutions of the embodiment and a comparative example in the same size, and FIG. 39 illustrates a comparison between sizes of the embodiment and the comparative example in the same number of light sources.

Referring to FIGS. 38 and 39, a comparative example B is a configuration in which a light emitting element package as a light source is arranged on a flexible printed circuit board, and an embodiment A is a configuration in which light emitting chips as a light source are arranged on the flexible printed circuit board. Thus, an interval between lights in the light emitting element package of the comparative example may be wider an interval between the light emitting chips of the embodiment. Thus, when resolutions of the comparative example and the embodiment in the same display size are compared with each other, it can be identified that a resolution of the embodiment is further improved. Because the larger number of light sources may be arranged in the same size, the resolution is improved as compared with the comparative example.

Further, FIG. 38 is a view illustrating a comparison between sizes in which the same number of light sources are arranged in a matrix. Even when the same number of packages are arranged by a light emitting element in the comparative example B, the size of the comparative example B is larger than the size of the embodiment A in which the light emitting chips are arranged. Accordingly, in the embodiment in which the light emitting chips are arranged, the resolution may be improved and the size may be smaller as well, as compared with the comparative example. Further, because the light emitting chips are arranged such that the size thereof is smaller and an interval therebetween is narrower, a stress applied to the light source module becomes smaller, so that the arrangement is effective in bending.

The light source module according to the embodiment may individually control a plurality of light emitting chips to be switched on/off to display desired information. Further, because the light source module may be used while being bent with respect to a first direction, the light source module may be used for a display module having a light source module. Further, the light source module may be used for an accessory such as a watch, a ring and a portable terminal having a light source module. Further, in the embodiment, lenses may be arranged on the light emitting chips, respectively, but the present disclosure is not limited thereto.

The light source module according to the embodiment may be applied to a lighting device such as a light, a traffic light, a headlight, an electric light and a streetlight as well as a backlight unit of a portable terminal, a computer or the like, but the present disclosure is not limited thereto.

Meanwhile, the above-described light source module may be applied to an accessory.

Figure 41:
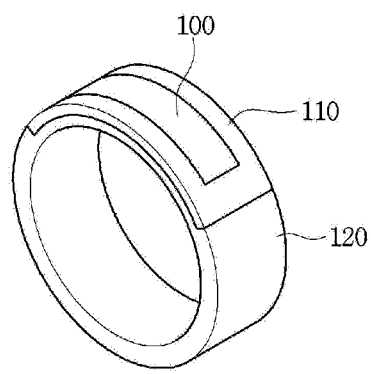
FIG. 41 is a perspective view illustrating an accessory including a flexible light source module according to the embodiment.

FIG. 41 is a perspective view illustrating an accessory including a flexible light source module according to an embodiment.

Referring to FIG. 41, the accessory including the flexible light source module according to the embodiment includes a body 120, a display unit 110 that is arranged an upper end of the body 120 and includes a recess, and a light source module 100 that is arranged on the recess of the display unit 110.

The body 120 may be formed of metal, but the present disclosure is not limited thereto. In an embodiment, the accessory may be at least one of a ring, a necklace, an earring and a bracelet, and the size of the body 120 may be changed based on the size and the kind of the accessory.

The display unit 110 may be arranged at the upper end of the body 120, and may include a recess. The size of the recess is not limited, and may be smaller than the width and the depth of the display unit 110.

The light source module 100 may be arranged within the recess of the display unit 110. The light source module 100 includes a reflective member that is arranged on a circumference of a light emitting area on a flexible printed circuit board, a plurality of light emitting chips that are arranged within the reflective member, and a mold member that covers the plurality of light emitting chips within the reflective member. That is, the light source module 100 may be bent at a predetermined curvature and may provide information while being attached to an accessory having a curvature. The light source module according to the embodiment will be described in detail with reference to FIG. 5 to @@@@.

A cover part (not illustrated) may be arranged on the light source module 100 to protect the light source module 100, and the cover part may be formed of at least one of flexible transparent synthetic resin and flexible transparent colored synthetic resin.

Figure 42:
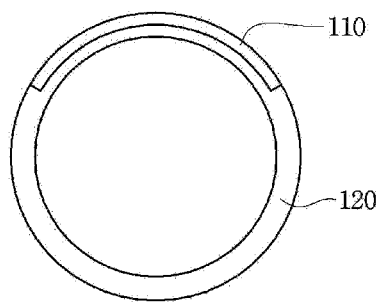
FIG. 42 is a front view illustrating the accessory including the flexible light source module according to the embodiment.
Figure 43:
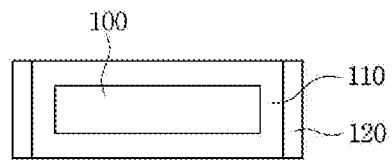
FIG. 43 is a side view illustrating the accessory including the flexible light source module according to the embodiment.

FIG. 42 is a front view illustrating the accessory including the flexible light source module according to the embodiment, and FIG. 43 is a side view illustrating the accessory including the flexible light source module according to the embodiment.

Referring to FIG. 42, the display unit 110 may be arranged at the upper end of the body 120. In FIG. 42, the display unit 110 is arranged at the upper end of the body 120, but the present disclosure is not limited thereto. Further, according to embodiments, the display unit 110 may be arranged to surround the entire body 120.

Referring to FIG. 43, the light emitting module 100 may be arranged within the display unit 110, and the display unit 110 may fix the light emitting module 100. The light emitting module 100 has been described with reference to FIGS. 1 to 40.

Figure 44:
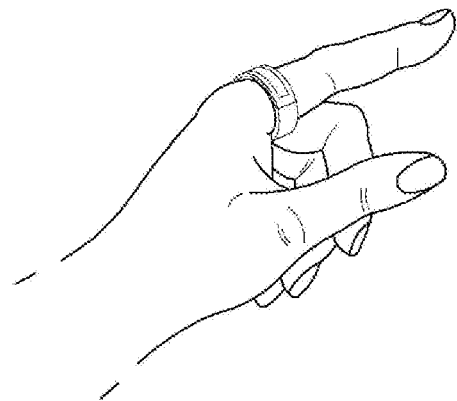
FIG. 44 is a use state view illustrating a state in which the accessory including the flexible light source module is mounted.

FIG. 44 is a use state view illustrating a state in which the accessory including the flexible light source module is mounted.

Referring to FIG. 44, the accessory according to the embodiment is a ring including the flexible light source module, the flexible light source module is smaller than the exiting flexible light source module, and thus may have a high curvature, and visibility thereof is improved even when the flexible light source module is mounted to a small-sized ring.

Meanwhile, the above-described light source module may be applied to a room mirror of a vehicle.

Figure 45:
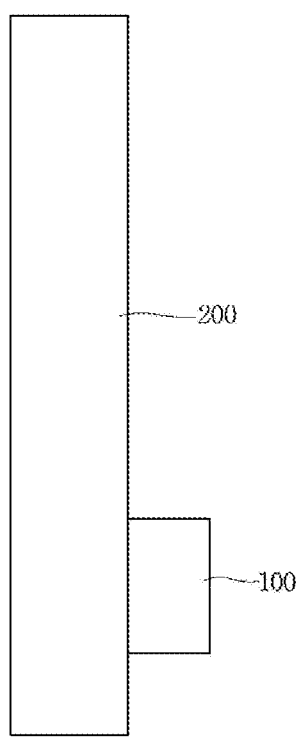
FIG. 45 is a side view illustrating a structure of a mirror having a display function according to an embodiment of the present disclosure.

FIG. 45 is a side view illustrating a structure of a mirror having a display function according to an embodiment of the present invention.

Referring to FIG. 45, the mirror having a display function according to the embodiment may include a mirror part 200 that is arranged in a vehicle to detect a rear situation of the vehicle and a light source module 100 that is formed on at least a portion of a rear surface of the mirror part 200.

The mirror part 200 is a mirror that is provided in the vehicle and is mounted such that a driver ensures a rear visual field.

Here, the mirror part 200 may be a side mirror that is provided outside the vehicle, or differently, may be a room mirror that is provided inside the vehicle. Hereinafter, descriptions will be made while assuming that the mirror part 200 is the room mirror that is arranged inside the vehicle.

The mirror part 200 may be a general mirror or a half mirror that has both penetrability and reflexibility of light on a front surface thereof, but preferably may be an electrochromic mirror (ECM) that changes reflexibility of the room mirror 100 to prevent a glaring phenomenon which the driver may feel by reflection of light by a headlight of a following vehicle.

In more detail, the mirror part 200 changes reflexibility of the mirror part 200 using an oxidation reduction reaction of an electrochromic element based on a difference in brightness of light measured by a light quantity sensor, such as a photodiode, which measures brightness of a front side and a rear side of the vehicle.

Accordingly, glaring of the driving by the headlight of the following vehicle is suppressed so that the present disclosure is helpful in achieving safe driving.

A structure of the mirror part 200 will be described in detail with reference to drawings which will be illustrated below.

The light source module 100 is arranged on a rear surface of the mirror part 200 to output light to a front surface of the mirror part 200.

At this time, the light source module 100, which is a display device that is manufactured by directly mounting not a light emitting element package but a plurality of light emitting chips on a substrate, displays various pieces of information related to driving of the vehicle through individually controlling the plurality of light emitting chips.

That is, a mirror having a display function according to the related art is implemented by arranging an LCD module on a rear surface of a mirror part. At this time, because an LCD is located on a rear surface of a reflective layer of the mirror part, the mirror according to the related art is implemented such that a formation thickness of a reflective material of a side of a reflective layer of a cell to which the LCD is attached is formed thinner than that of other areas and reflexibility of the entire reflective layer is reduced such that brightness of light emitted from the LCD is not reduced by the reflective layer. However, in this case, there are problems in that manufacturing processes of the mirror become complex and characteristics of the mirror deteriorate as well. The present invention provides a mirror having a display function, which does not require a separate additional display space for adjusting reflexibility thereof or changing a thickness thereof as in the related art, when a light source module is arranged on a rear surface of a mirror part.

The reason why the display space is not required is that information related to the vehicle is applied using light emitting chips provided in the light source module 100.

Figure 46:
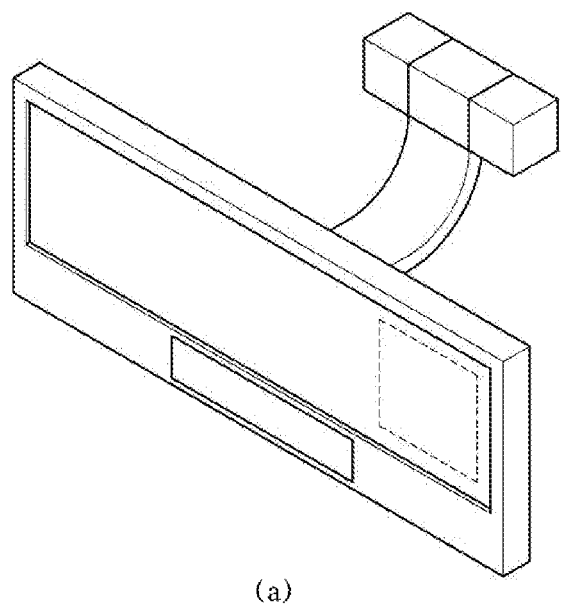
FIG. 46 is a view schematically illustrating a room mirror according to the related art.
Figure 46:
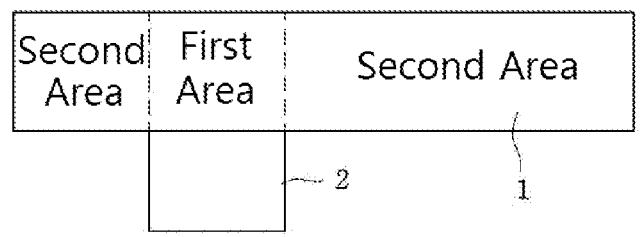

FIG. 46 is a view schematically illustrating a room mirror according to the related art.

Referring to FIG. 46, a display room mirror according to the related art includes a mirror part 1, a display module 2 that is installed on a rear surface of the mirror part 1, and a fixing member 3 that fixes the display room mirror to a front glass of a vehicle.

As illustrated in FIG. 46B, the mirror part 1 includes a first area that overlaps the display module 2 and a second area except for the first area.

At this time, in the above-described display room mirror, the display module 2 should be located inside the mirror part 1.

Accordingly, characteristics of the first area and characteristics of the second area of the mirror part 1 are different from each other.

In other words, an image output through the display module 2 passes through the first area of the mirror part 1 and is displayed through a front surface of the mirror part 1. At this time, the mirror part 1 has reflexibility of a predetermined level or higher, and an image generated by the display module 2 cannot be penetrated due to the reflexibility of the mirror part 1.

Thus, in the display room mirror according to the related art, a separate display space is provided in the mirror part 1.

That is, in the room mirror according to the related art, reflexibility of the first area of the mirror part 1 should be formed lower than reflexibility of the second area thereof or a separate space for a separate display, which is obtained by forming a thickness of the first area thinner than a thickness of the second area by removing a portion of the first area of the mirror part 1, should be provided.

However, the present invention may resolve the above-described problems according to the related art using the above-described light source module 100.

Figure 47:
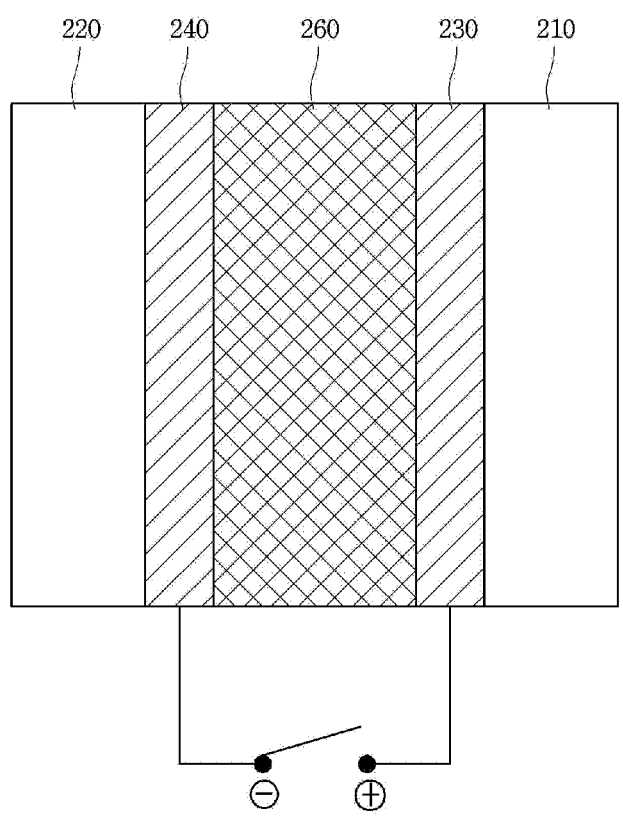
FIGS. 47 and 48 are views illustrating schematic structures of a mirror part according to the embodiment of the present disclosure.
Figure 48:
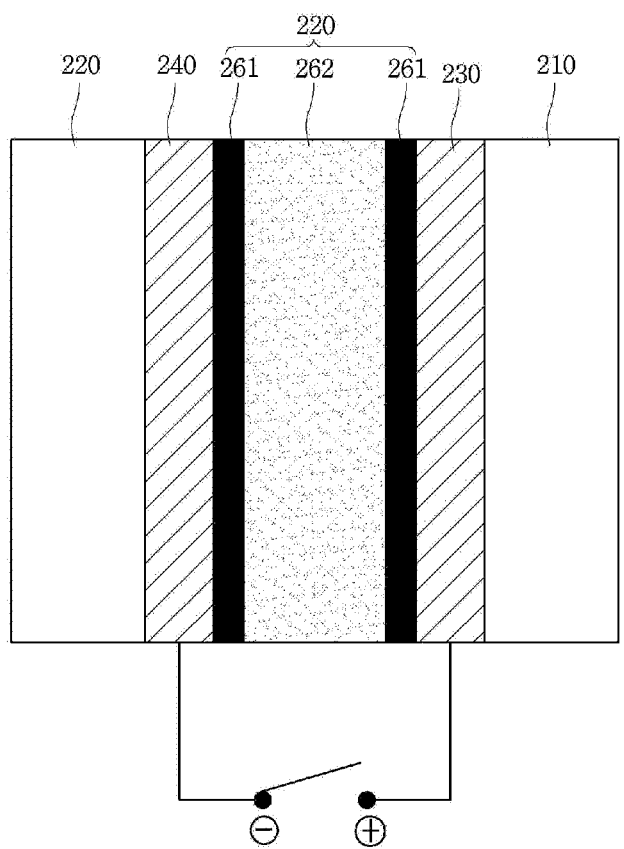

FIGS. 47 and 48 are views illustrating schematic structures of a mirror art according to the embodiment of the present invention.

Referring to FIG. 47, a mirror part 200 is an electrochromic mirror (ECM).

The mirror part 200 may include a first transparent substrate 210 and a second transparent substrate 220 that are opposite to each other with a predetermined interval, a first transparent electrode 230 and a conductive reflective layer 240 that are formed on surfaces facing the first and second transparent substrates 210 and 220, and an electrochromic layer that is formed between the first transparent electrode 230 and the conductive reflective layer 240.

The mirror part 200, which is formed using electrochromic substances, optical characteristics of which may be reversibly changed by an electrochemical oxidation reduction reaction, is not colored when an electric signal is not applied from the outside and is colored when the electric signal is applied, thereby adjusting reflexibility of a mirror.

It is preferred that the first and second transparent substrates 210 and 220 are glass substrates, but is not necessarily limited thereto, and may be formed of a transparent material such as synthetic resin and aerogel.

The transparent electrode 230 is deposited on the first transparent substrate 210 and may be formed of any one selected from the group consisting of indium tin oxide (ITO), fluor doped tin oxide (FTO), aluminum doped zinc oxide (AZO), gallium doped zinc oxide (GZO), antimony doped tin oxide (ATO), indium doped zinc oxdie (IZO), niobium doped titanium oxide (NTO) and ZnO and combinations thereof. However, said feature is merely one example, and the present disclosure is not necessarily limited thereto.

The conductive reflective layer 240 is formed on the second transparent substrate 220, serves as a reflective plate that reflects light input through the electrochromic layer 260 and serves as a counter electrode of the first transparent electrode 230. The conductive reflective layer 240 may be formed of at least one kind of metal selected from the group consisting of Cu, Au, Ag, Ni, Al, Cr, Ru, Re, Pb, Sn, In and Zn or an alloy consisting of these metals. However, said feature is merely one example, and the present disclosure is not necessarily limited thereto. Further, although not illustrated in the drawings, the conductive reflective layer 240 may have two layers of a second transparent electrode and a reflective layer.

That is, the conductive reflective layer 240 may have the second transparent electrode that serves as a counter electrode of the first transparent electrode and the reflective plate that reflects incident light.

Here, the second transparent electrode may be formed of any one selected from the group consisting of indium tin oxide (ITO), fluor doped tin oxide (FTO), aluminum doped zinc oxide (AZO), gallium doped zinc oxide (GZO), antimony doped tin oxide (ATO), indium doped zinc oxide (IZO), niobium doped titanium oxide (NTO) and ZnO and combinations thereof.

Further, the reflective layer may be formed of at least one kind of metal selected from the group consisting of Cu, Au, Ag, Ni, Al, Cr, Ru, Re, Pb, Sn, In and Zn and an alloy consisting of these metals.

The electrochromic layer 260 is formed of liquefied or solidified electrochromic substances and an electrolyte, is formed between the first transparent electrode 230 and the conductive reflective layer 240, and receives applied electric power from the first transparent electrode 230 and the conductive reflective layer 240 to be colored or decolored through an oxidation reaction or a reduction reaction.

The electrochromic layer 260 may be formed by injecting electrochromic substances and electrolytes into a space between the first transparent electrode 230 and the conductive reflective layer 240 and performing a vacuum bonding scheme. The electrochromic substances may be organic or inorganic electrochromic substances. The organic electrochromic substances may be viologen, anthraquinone, polyaniline or polythiophene, and the inorganic electrochromic substances may be $WO_3$, $MoO_3$, $CeO_3$, $MnO_2$ or $Nb_2O_5$.

Here, when the electrochromic substances are solidified, the electrochromic layer 260 may include an electrolyte layer 262 and an electrochromic coating layer 261 that is formed on one surface or opposite surfaces of the electrolyte layer 262.

That is, as illustrated in FIG. 47, the electrochromic coating layer 261 may be formed on the opposite surfaces of the electrolyte layer 262, and may be formed only between the electrolyte layer 262 and the first transparent electrode 230 or only between the electrolyte layer 262 and the conductive reflective layer 240 as well, although not illustrated in the drawings. Further, when a thickness of the electrochromic coating layer 261 is lower than 100 nm, it is difficult to achieve a unique function of the electrochromic substances, and when the thickness thereof exceeds 700 nm, a durability problem that a crack is generated occurs. Accordingly, it is preferred that the electrochromic coating layer 261 is formed to have a thickness of 100 nm to 700 nm, but the present disclosure is not necessarily limited thereto.

When the electrochromic substances are liquefied, uniform discoloration is not achieved and power consumption is large because a voltage should be continuously applied to maintain a discoloration state. However, when the solidified electrochromic coating layer 161 is formed as described above, uniform discoloration and decolorization may be achieved. Further, the electrochromic substances have a memory effect, and thus power consumption becomes small because a voltage needs to be applied only at discoloration and decolorization and a speed of a decolorization reaction is rapid because a reverse voltage is applied at decolorization. Further, because electrochromic substances to which a coating method is applied are inorganic polymers or organic polymers, durability of the elements may be improved.

In this way, reflexibility of the mirror part 200 is changed using an oxidation reduction reaction of electrochromic elements based on brightness of light, so that a glaring phenomenon of a driver may be suppressed.

What is claimed is:

1. A light source module comprising:
a flexible printed circuit board that has first and second pads;
a plurality of light emitting chips that are arranged on the first pads of the flexible printed circuit board, respectively;
a reflective member encompassing the plurality of light emitting chips; and
a mold member arranged within the reflective member and covering the light emitting chips,
wherein the plurality of light emitting chips comprises:
a plurality of first arrays arranged in a first direction, and
a plurality of second arrays arranged in a second direction that is different from the first direction;
wherein at least two of the light emitting chips in each first array are connected to each other by the flexible printed circuit board,
wherein light emitting chips of each second array are electrically isolated from each other,
wherein the light source module further comprises connection members, each of which is connected to at least one of the light emitting chips of the second arrays,
wherein at least one of the connection members is connected to the second pads of the flexible printed circuit board,
wherein the connection members extend in the second direction,
wherein each light emitting chip includes a first electrode and a second electrode,
wherein the second electrodes of at least two of the light emitting chips in each first array are disposed on each first pad and are connected to that first pad,
wherein each first pad disposed underneath the light emitting chips extends in the first direction,
wherein the first electrode of each light emitting chip is connected to each connection member, respectively;
wherein the mold member covers the first arrays and the second arrays and contacts the light emitting chips of the first and second arrays, and
wherein bottom surfaces of the first and second pads are spaced apart from a bottom surface of the flexible printed circuit board.

2. The light source module of claim 1, wherein a length of the flexible printed circuit board in the first direction is larger than a length thereof in the second direction,
wherein the number of light emitting chips in each first array is 1.5 times larger than the number of light emitting chips in each second array,
wherein a region of an upper surface of the mold member has a length in the first direction 1.5 times larger than a length in the second direction, and
wherein the region of the upper surface of the mold member has a light emitting area in which the plurality of light emitting chips is arranged.

3. The light source module of claim 1, wherein the number of light emitting chips arranged in each first array is 1.5 times larger than the number of light emitting chips arranged in each second array,
wherein each of the plurality of light emitting chips of the first and second arrays is respectively turned on or turned off, and
wherein the first direction is perpendicular to the second direction.

4. The light source module of claim 1, wherein the second pads are arranged between adjacent light emitting chips of the plurality of light emitting chips arranged in each second array, respectively, and
wherein the first direction is perpendicular to the second direction.

5. The light source module of claim 4, wherein each of the connection members interconnects the first electrodes of adjacent light emitting chips arranged in the first arrays.

6. The light source module of claim 4, wherein each of the connection members comprises a conductive wire, and
wherein each of the connection members is connected to each of the second pads, respectively, and is disposed in the second direction.

7. The light source module of claim 4, wherein a length of the flexible printed circuit board in the first direction is larger than a length thereof in the second direction,
wherein a stress applied in the second direction is smaller than a stress applied in the first direction, and
wherein a region of an upper surface of the mold member has a length in the first direction 1.5 times larger than a length in the second direction.

8. The light source module of claim 1, further comprising blocking walls that are respectively arranged between adjacent light emitting chips of the plurality of light emitting chips.

9. The light source module of claim 8, wherein upper surfaces of the blocking walls are positioned lower than an upper surface of the mold member.

10. The light source module of claim 8, wherein the blocking walls are arranged in at least one of the first direction and the second direction, and
wherein the blocking walls are disposed in at least one of regions between the plurality of first arrays and regions between the plurality of second arrays.

11. The light source module of claim 1, further comprising grooves concave from an upper surface of the mold member,
wherein the grooves are arranged in at least one of the first and second directions, and
wherein a depth of each of the grooves is smaller than a thickness of the mold member.

12. The light source module of claim 11, wherein reflective materials are disposed in the grooves.

13. The light source module of claim 1, wherein the connection members comprise:
a plurality of first connection layers arranged within the mold member and connected to the plurality of light emitting chips, respectively; and
second connection layers arranged on the mold member, wherein each second connection layer interconnects the plurality of first connection layers and the light emitting chips in each second array, respectively.

14. The light source module of claim 13,
wherein the first electrode is formed on each of the light emitting chips and is connected to a corresponding first connection layer, and
wherein the second electrode is formed under each of the light emitting chips and is connected to a corresponding first pad of the flexible printed circuit board, and
wherein the first connection layers are arranged in a direction perpendicular to an upper surface of the mold member.

15. The light source module of claim 14, further comprising third connection layers that are arranged in the mold member and are connected to the second connection layers and the second pads.

16. The light source module of claim 15, wherein the mold member comprises:
first holes in which the first connection layers are respectively arranged,
second holes in which the third connection layers are respectively arranged, and
grooves on which the second connection layers are respectively formed.

17. The light source module of claim 13, further comprising a light-transmitting layer or a light-transmitting film that is formed on the mold member to protect the second connection layers.

18. The light source module of claim 1, wherein all the first pads disposed under each first array are connected to each other.

19. The light source module of claim 1, wherein a first interval between adjacent light emitting chips of the light emitting chips in each second array is larger or equal to a second interval between adjacent light emitting chips of the light emitting chips in each first array, and
wherein the first interval is larger than at least one of transverse and longitudinal lengths of each light emitting chip.

20. The light source module of claim 1, wherein the flexible printed circuit board includes an insulating film, a first cover disposed on the insulating film, a first wiring layer between the first cover and the insulating film, an adhesive layer under the insulating film, a second wiring layer between the insulating film and the adhesive layer, and a second cover disposed under the adhesive layer, and
wherein the first wiring layer includes the first and second pads.

* * * * *